US010727029B2

(12) United States Patent
Ulrich et al.

(10) Patent No.: US 10,727,029 B2
(45) Date of Patent: Jul. 28, 2020

(54) IMPEDANCE MATCHING USING INDEPENDENT CAPACITANCE AND FREQUENCY CONTROL

(71) Applicant: Reno Tchnologies, Inc., Wilmington, DE (US)

(72) Inventors: Michael Gilliam Ulrich, Delran, NJ (US); Imran Ahmed Bhutta, Moorestown, NJ (US)

(73) Assignee: RENO TECHNOLOGIES, INC, Wilmington, DE (US)

( * ) Notice: Subject to any disclaimer, the term of this patent is extended or adjusted under 35 U.S.C. 154(b) by 0 days.

(21) Appl. No.: 16/524,805

(22) Filed: Jul. 29, 2019

(65) Prior Publication Data

US 2019/0355554 A1  Nov. 21, 2019

Related U.S. Application Data

(63) Continuation-in-part of application No. 16/502,656, filed on Jul. 3, 2019, which is a continuation-in-part
(Continued)

(51) Int. Cl.
*H01J 7/24* (2006.01)
*H05B 31/26* (2006.01)
(Continued)

(52) U.S. Cl.
CPC .... *H01J 37/32183* (2013.01); *H01L 21/0262* (2013.01); *H01L 21/3065* (2013.01); *H01J 2237/334* (2013.01)

(58) Field of Classification Search
CPC ....... H05H 1/46; H05H 1/24; H01J 37/32082; H01J 37/32192; H01J 37/32174;
(Continued)

(56) References Cited

U.S. PATENT DOCUMENTS 3,828,281 A  8/1974  Chambers
4,110,700 A  8/1978  Rosen et al.
(Continued)

FOREIGN PATENT DOCUMENTS

EP  0840349  5/1998
EP  0840350  5/1998
WO  2006096589  9/2006

*Primary Examiner* — Minh D A
(74) *Attorney, Agent, or Firm* — The Belles Group, P.C.

(57) ABSTRACT

In one embodiment, the present disclosure is directed to an RF impedance matching network that includes an RF input coupled to an RF source, an RF output coupled to a plasma chamber, and an electronically variable capacitor (EVC). A first control circuit controls the EVC and is separate and distinct from a second control circuit controlling the RF source. To assist in causing an impedance match between the RF source and the plasma chamber, the first control circuit determines, using a match lookup table with a value based on a detected RF parameter, a new EVC configuration for providing a new EVC capacitance. To further cause the impedance match, the second control circuit alters the variable frequency of the RF source, but operates independently from the first control circuit.

21 Claims, 13 Drawing Sheets

Related U.S. Application Data of application No. 16/029,742, filed on Jul. 9, 2018, now Pat. No. 10,483,090.

(60) Provisional application No. 62/530,446, filed on Jul. 10, 2017, provisional application No. 62/693,625, filed on Jul. 3, 2018, provisional application No. 62/711,141, filed on Jul. 27, 2018.

(51) Int. Cl.
   *H01J 37/32* (2006.01)
   *H01L 21/02* (2006.01)
   *H01L 21/3065* (2006.01)

(58) Field of Classification Search
   CPC ............ H01J 37/321; H01J 37/3211; H01J 37/32623; H01J 37/08; H01J 37/3171; H01J 27/18; H01J 27/08; H01J 27/14; B82Y 10/00
   See application file for complete search history.

(56) References Cited

U.S. PATENT DOCUMENTS

| | | | |
|---|---|---|---|
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,654,679 A | 8/1997 | Mavretic et al. |
| 5,815,047 A | 9/1998 | Sorensen et al. |
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |
| 6,252,354 B1 | 6/2001 | Collins et al. |
| 6,400,012 B1 | 6/2002 | Miller et al. |
| 6,424,232 B1 | 7/2002 | Mavretic et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| RE39,051 E | 3/2006 | Harnett |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,199,678 B2 | 4/2007 | Matsuno |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | McKinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | McKinzie, III |
| 7,728,602 B2 | 6/2010 | Valcore et al. |
| 7,745,955 B2 | 6/2010 | Kirchmeier et al. |
| 7,755,300 B2 | 7/2010 | Kishinevsky et al. |
| 7,764,140 B2 | 7/2010 | Nagarkatti et al. |
| 7,777,567 B2 | 8/2010 | Polizze |
| 7,852,170 B2 | 12/2010 | McKinzie, III |
| 7,863,996 B2 | 1/2011 | Cotter et al. |
| 7,868,556 B2 | 1/2011 | Xia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | McKinzie, III |
| 8,040,068 B2 | 10/2011 | Coumou et al. |
| RE42,917 E | 11/2011 | Hauer et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,217,731 B2 | 7/2012 | McKinzie, III |
| 8,217,732 B2 | 7/2012 | McKinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | McKinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | McKinzie, III |
| 8,559,907 B2 | 10/2013 | Burgener et al. |
| 8,564,381 B2 | 10/2013 | McKinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlicek et al. |
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,083,343 B1 | 7/2015 | Li et al. |

(56) References Cited

U.S. PATENT DOCUMENTS

| | | |
|---|---|---|
| 9,190,993 B1 | 11/2015 | Li |
| 9,306,533 B1 | 4/2016 | Anton |
| 2002/0060914 A1 | 5/2002 | Porter et al. |
| 2002/0185227 A1* | 12/2002 | MacGearailt ....... H01J 37/3299 156/345.43 |
| 2003/0007372 A1 | 1/2003 | Porter et al. |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |
| 2017/0345620 A1* | 11/2017 | Coumou ............ H01J 37/32183 |
| 2020/0144032 A1* | 5/2020 | Ulrich ............... H01L 21/28556 |

\* cited by examiner

IMPEDANCE MATCHING USING INDEPENDENT CAPACITANCE AND FREQUENCY CONTROL

CROSS REFERENCE TO RELATED APPLICATIONS

The present application is a continuation in part of U.S. patent application Ser. No. 16/502,656, filed Jul. 3, 2019, which is a continuation in part of U.S. patent application Ser. No. 16/029,742, filed Jul. 9, 2018, which claims the benefit of U.S. Provisional Patent Application No. 62/530,446, filed Jul. 10, 2017. U.S. patent application Ser. No. 16/502,656 further claims the benefit of U.S. Provisional Patent Application No. 62/693,625, filed Jul. 3, 2018. The present application further claims the benefit of U.S. Provisional Patent Application No. 62/711,141, filed Jul. 27, 2018. The disclosures of the foregoing references are incorporated herein by reference in their entireties.

BACKGROUND

The semiconductor device fabrication process uses plasma processing at different stages of fabrication to make a semiconductor device such as a microprocessor, a memory chip, or another integrated circuit or device. Plasma processing involves energizing a gas mixture by imparting energy to the gas molecules by the introduction of RF (radio frequency) energy into the gas mixture. This gas mixture is typically contained in a vacuum chamber, also called a plasma chamber, and the RF energy is introduced through electrodes or other means in the chamber. In a typical plasma process, the RF generator generates power at the desired RF frequency and power, and this power is transmitted through the RF cables and networks to the plasma chamber.

To provide efficient transfer of power from the RF generator to the plasma chamber, an RF matching network is positioned between the RF generator and the plasma chamber. The purpose of the RF matching network is to transform the plasma impedance to a value suitable for the RF generator. In many cases, particularly in the semiconductor fabrication processes, the RF power is transmitted through 50 Ohm coaxial cables and the system impedance (output impedance) of the RF generators is also 50 Ohm. On the other hand, the impedance of the plasma, driven by the RF power, varies. The impedance on the input side of the RF matching network must be transformed to non-reactive 50 Ohm (i.e., 50+j0) for maximum power transmission. RF matching network perform this task of continuously transforming the plasma impedance to 50 Ohm for the RF generator.

A typical RF matching network is composed of variable capacitors and a microprocessor-based control circuit to control the capacitors. The value and size of the variable capacitors are influenced by the power handling capability, frequency of operation, and impedance range of the plasma chamber. The predominant variable capacitor in use in RF matching networks is the vacuum variable capacitor (VVC). The VVC is an electromechanical device, consisting of two concentric metallic rings that move in relation to each other to change the capacitance. In complex semiconductor processes, where the impedance changes are very rapid, the rapid and frequent movements put stresses on the VVC leading to their failures. VVC-based RF matching networks are one of the last electromechanical components in the semiconductor fabrication process.

As semiconductor devices shrink in size and become more complex, however, the feature geometries become very small. As a result, the processing time to fabricate these features becomes small, typically in the 5-6 second range. Current RF matching networks take 1-2 seconds to tune the process and this results in unstable process parameters for a significant portion of the process time. Electronically variable capacitor (EVC) technology (see, e.g., U.S. Pat. No. 7,251,121, incorporated herein by reference) enables a reduction in this semiconductor processing tune time from 1-2 seconds to less than 500 seconds. EVC-based matching networks are a type of solid state matching network. Their decreased tune time greatly increases the available stable processing time, thereby improving yield and performance.

While EVC technology is known, it has yet to be developed into an industry-accepted replacement for VVCs. However, because an EVC is purely an electronic device, an EVC is not a one-for-one replacement for a VVC in an RF matching network. Further advancements are therefore needed to more fully take advantage of using EVCs as part of an RF matching network.

BRIEF SUMMARY

The present disclosure may be directed, in one aspect, to a radio frequency (RF) impedance matching network comprising an RF input configured to operably couple to an RF source having a variable frequency; an RF output configured to operably couple to a plasma chamber having a variable chamber impedance; an electronically variable capacitor (EVC) having a variable capacitance; a first control circuit operably coupled to the EVC and to a sensor configured to detect an RF parameter, the first control circuit controlling the EVC and being separate and distinct from a second control circuit controlling the RF source; wherein, to assist in causing an impedance match between the RF source and the plasma chamber, the first control circuit is configured to determine, using a match lookup table with a value based on the detected RF parameter, a new EVC configuration for providing a new EVC capacitance; and alter the EVC to the new EVC configuration; and wherein the first control circuit does not provide instructions to the second control circuit for controlling the variable frequency of the RF source, such that, in further causing the impedance match between the RF source and the plasma chamber, the second control circuit alters the variable frequency of the RF source independently from the first control circuit.

In another aspect, the present disclosure may be directed to a method of impedance matching comprising operably coupling an RF input of an impedance matching network to an RF source having a variable frequency; operably coupling an RF output of the impedance matching network to a plasma chamber having a variable chamber impedance, wherein the impedance matching network further comprises an electronically variable capacitor (EVC) having a variable capacitance, and the impedance matching network is configured to cause an impedance match between the RF source and the plasma chamber; operably coupling a first control circuit to the EVC and to a sensor, the first control circuit controlling the EVC and being separate and distinct from a second control circuit controlling the RF source; detecting, by the sensor, an RF parameter; determining, by the first control circuit, using a match lookup table with a value based on the detected RF parameter, a new EVC configuration for providing a new EVC capacitance, altering, by the first control circuit, the EVC to the new EVC configuration; and altering, by the second control circuit, the variable frequency of the RF source; wherein the first control circuit does not provide instructions to the second control circuit for controlling the variable frequency of the RF source.

In another aspect, the present disclosure may be directed to a method of manufacturing a semiconductor comprising placing a substrate in a plasma chamber configured to deposit a material layer onto the substrate or etch a material layer from the substrate; and energizing plasma within the plasma chamber by coupling RF power from an RF source into the plasma chamber to perform a deposition or etching, and while energizing the plasma, causing an impedance match between the RF source and the plasma chamber by operably coupling an RF input of an impedance matching network to the RF source, the RF source having a variable frequency; operably coupling an RF output of the impedance matching network to the plasma chamber, the plasma chamber having a variable chamber impedance, wherein the impedance matching network further comprises an electronically variable capacitor (EVC) having a variable capacitance; operably coupling a first control circuit to the EVC and to a sensor, the first control circuit controlling the EVC independently from a second control circuit controlling the RF source; detecting, by the sensor, an RF parameter; determining, by the first control circuit, using a match lookup table with a value based on the detected RF parameter, new EVC configuration for providing a new EVC capacitance; and altering, by the first control circuit, the EVC to the new EVC configuration; and altering by the second control circuit, the variable frequency of the RF source; wherein the first control circuit does not provide instructions to the second control circuit for controlling the variable frequency of the RF source.

In another aspect, the present disclosure may be directed to a semiconductor processing tool comprising a plasma chamber configured to deposit a material onto a substrate or etch a material from the substrate; and an impedance matching network operably coupled to the plasma chamber, matching circuit comprising an RF input configured to operably couple to an RF source having a variable frequency; an RF output configured to operably couple to the plasma chamber, the plasma chamber having a variable chamber impedance; an electronically variable capacitor (EVC) having a variable capacitance; a first control circuit operably coupled to the EVC and to a sensor configured to detect an RF parameter, the first control circuit controlling the EVC and being separate and distinct from a second control circuit controlling the RF source; wherein, to assist in causing an impedance match between the RF source and the plasma chamber, the first control circuit is configured to determine, using a match lookup table with a value based on the detected RF parameter, a new EVC configuration for providing a new EVC capacitance; and alter the EVC to the new EVC configuration; and wherein the first control circuit does not provide instructions to the second control circuit for controlling the variable frequency of the RF source, such that, in further causing the impedance match between the RF source and the plasma chamber, the second control circuit alters the variable frequency of the RF source independently from the first control circuit.

BRIEF DESCRIPTION OF THE DRAWINGS

The present disclosure will become more fully understood from the detailed description and the accompanying drawings, wherein.

DETAILED DESCRIPTION

Figure 1:
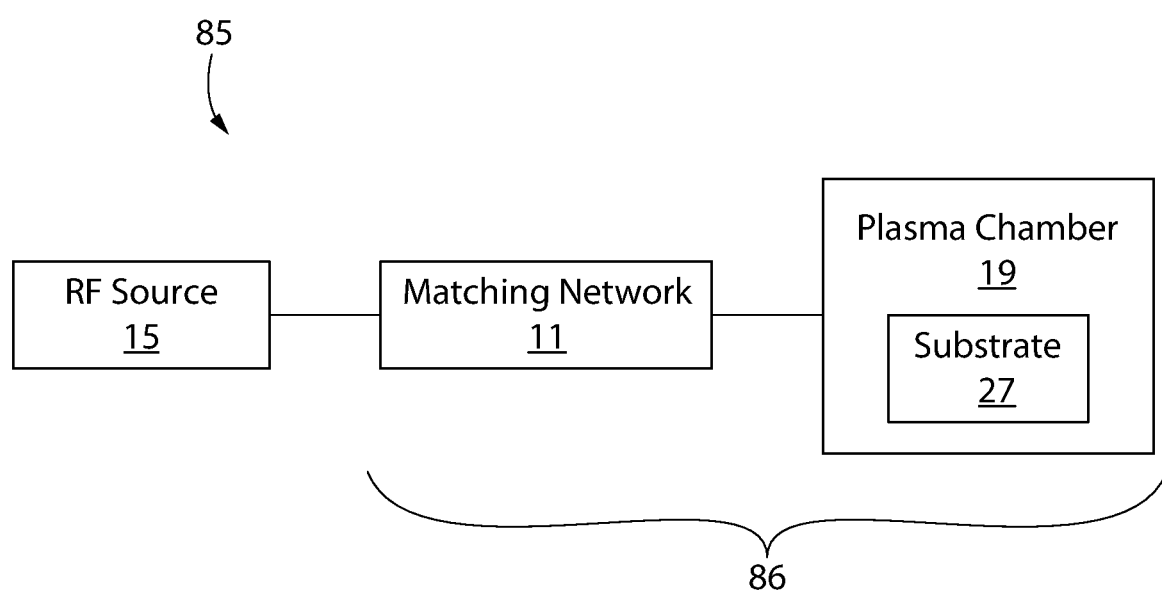
FIG. 1 is a block diagram of an embodiment of a semiconductor processing system.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present inventions. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Semiconductor Processing System

Referring to FIG. 1, a semiconductor device processing system 5 utilizing an RF generator 15 is shown. The system 85 includes an RF generator 15 and a semiconductor processing tool 86. The semiconductor processing tool 86 includes a matching network 11 and a plasma chamber 19. In other embodiments, the generator 15 or other power source can form part of the semiconductor processing tool.

The semiconductor device can be a microprocessor, a memory chip, or other type of integrated circuit or device. A substrate 27 can be placed in the plasma chamber 19, where the plasma chamber 19 is configured to deposit a material layer onto the substrate 27 or etch a material layer from the substrate 27. Plasma processing involves energizing a gas mixture by imparting energy to the gas molecules by introducing RF energy into the gas mixture. This gas mixture is typically contained in a vacuum chamber (the plasma chamber 19), and the RF energy is typically introduced into the plasma chamber 19 through electrodes. Thus, the plasma can be energized by coupling RF power from an RF source 15 into the plasma chamber 19 to perform deposition or etching.

In a typical plasma process, the RF generator 15 generates power at a radio frequency—which is typically within the range of 3 kHz and 300 GHz—and this power is transmitted through RF cables and networks to the plasma chamber 19. In order to provide efficient transfer of power from the RF generator 15 to the plasma chamber 19, an intermediary circuit is used to match the fixed impedance of the RF generator 15 with the variable impedance of the plasma chamber 19. Such an intermediary circuit is commonly referred to as an RF impedance matching network, or more simply as an RF matching network. The purpose of the RF matching network 11 is to transform the variable plasma impedance to a value that more closely matches the fixed impedance of the RF generator 15. Commonly owned U.S. patent application Ser. No. 14/669,568, the disclosure of which is incorporated herein by reference in its entirety, provides an example of such a matching network.

Matching Network

Figure 2:
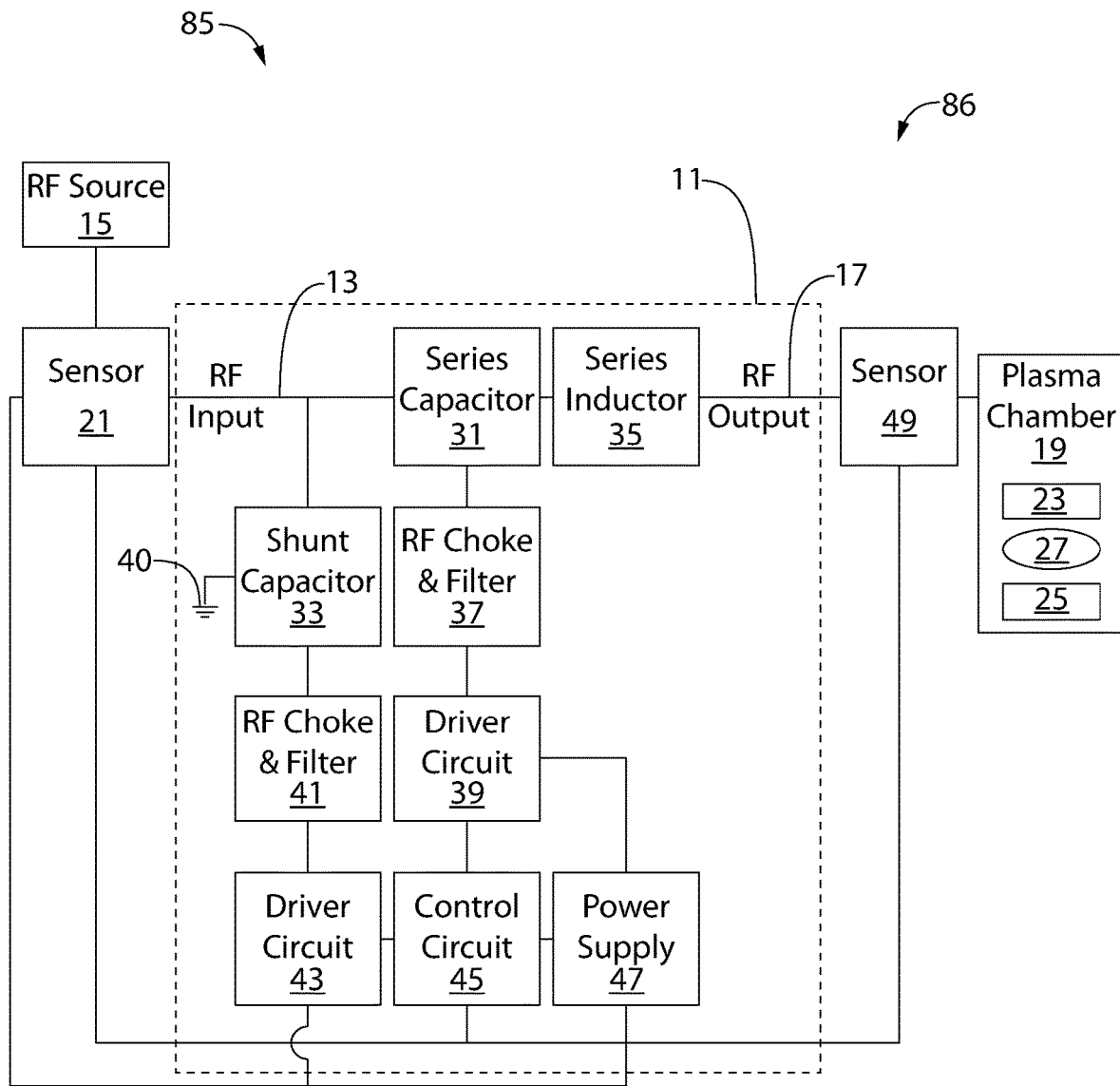
FIG. 2 is a block diagram of an embodiment of a semiconductor processing system having an L-configuration matching network.

FIG. 2 is a block diagram of an embodiment of a semiconductor processing system 85 having a processing tool 86 that includes an L-configuration RF impedance matching network 11. The matching network 11 has an RF input 13 connected to an RF source 15 and an RF output 17 connected to a plasma chamber 19. An RF input sensor 21 can be connected between the RF impedance matching network 11 and the RF source 15. An RF output sensor 49 can be connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

As discussed above, the RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

In the exemplified embodiment, the RF impedance matching network 11 includes a series variable capacitor 31, a shunt variable capacitor 33, and a series inductor 35 to form an 'L' type matching network. The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17.

Figure 3:
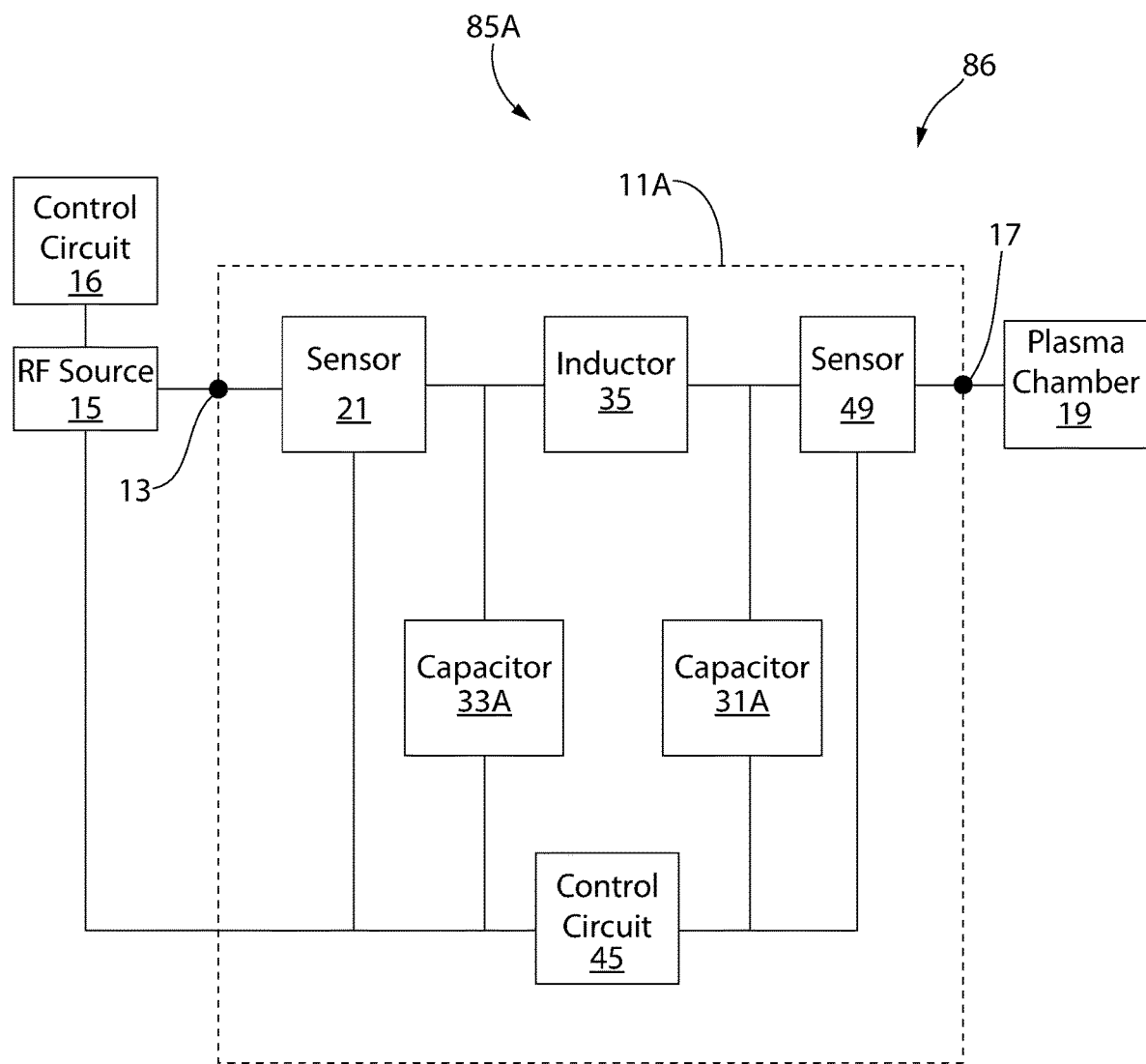
FIG. 3 is a block diagram of an embodiment of a semiconductor processing system having a pi-configuration matching network.

Alternatively, the RF impedance matching network 11 may be configured in other matching network configurations, such as a 'T' type configuration or a Π or 'pi' type configuration, as will be shown in FIG. 3. In certain embodiments, the variable capacitors and the switching circuit described below may be included in any configuration appropriate for an RF impedance matching network.

In the exemplified embodiment, each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device, such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

FIG. 3 is a block diagram of an embodiment of a semiconductor processing system 85A having a pi-configuration matching network 11A, as opposed to the L-configuration matching network of FIG. 2. For ease of understanding, this figure omits the RF chokes and filters, driver circuits, and power supplies of FIG. 2. Where FIG. 3 uses reference numbers identical to those of FIG. 2, it is understood that the relevant components can have features similar to those discussed with regard to FIG. 2.

The most significant difference between the L- and pi-configuration is that the L-configuration utilizes a series capacitor 31 and shunt capacitor 33, while the pi-configuration utilizes two shunt capacitors 31A, 33A. Nevertheless, the control circuit can alter the capacitance of these shunt variable capacitors 31A, 33A to cause an impedance match. Each of these shunt variable capacitors 31A, 33A can be an EVC, as discussed above. They can be controlled by a choke, filter, and driver similar to the methods discussed above with respect to FIG. 2.

EVC Capacitor Arrays

Figure 4:
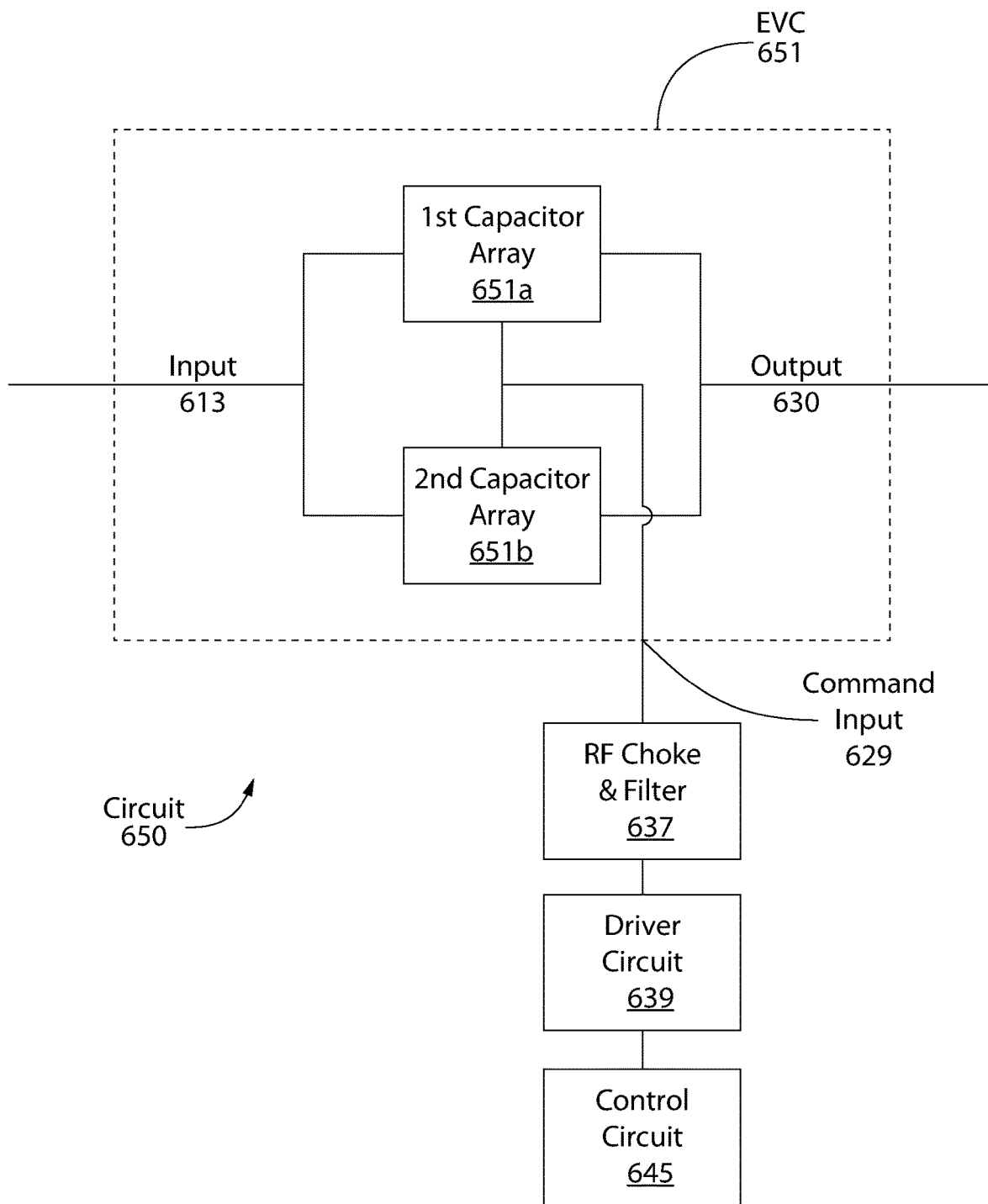
FIG. 4 is a block diagram of an embodiment of an electronic circuit for providing a variable capacitance using an electronically variable capacitor having two capacitor arrays.

FIG. 4 shows an electronic circuit 650 for providing a variable capacitance according to one embodiment. The circuit 650 utilizes an EVC 651 that includes two capacitor arrays 651a, 651b. The first capacitor array 651a has a first plurality of discrete capacitors, each having a first capacitance value. The second capacitor array 651b has a second plurality of discrete capacitors, each having a second capacitance value. The first capacitance value is different from the second capacitance value such that the EVC 651 can provide coarse and fine control of the capacitance produced by the EVC 651. The first capacitor array and the second capacitor array are coupled in parallel between a signal input 613 and a signal output 630.

The first and second capacitance values can be any values sufficient to provide the desired overall capacitance values for the EVC 651. In one embodiment, the second capacitance value is less than or equal to one-half ($\frac{1}{2}$) of the first capacitance value. In another embodiment, the second capacitance value is less than or equal to one-third ($\frac{1}{3}$) of the first capacitance value. In yet another embodiment, the second capacitance value is less than or equal to one-fourth ($\frac{1}{4}$) of the first capacitance value.

The electronic circuit 650 further includes a control circuit 645, which can have features similar to control circuit 45 discussed above. The control circuit 645 is operably coupled to the first capacitor array 651a and to the second capacitor array 651b by a command input 629, the command input 629 being operably coupled to the first capacitor array 651a and to the second capacitor array 651b. In the exemplified embodiment, the command input 629 has a direct electrical connection to the capacitor arrays 651a, 651b, though in other embodiments this connection can be indirect. The coupling of the control circuit 645 to the capacitor arrays 651a, 651b will be discussed in further detail below.

The control circuit 645 is configured to alter the variable capacitance of the EVC 651 by controlling on and off states of (a) each discrete capacitor of the first plurality of discrete capacitors and (b) each discrete capacitor of the second plurality of discrete capacitors. As stated above, the control circuit 645 can have features similar to those described with respect to control circuit 45 of FIGS. 2-3. For example, the control circuit 645 can receive inputs from the capacitor arrays 651a, 651b, make calculations to determine changes to capacitor arrays 651a, 651b, and delivers commands to the capacitor arrays 651a, 651b for altering the capacitance of the EVC 651. EVC 651 of FIG. 4 can include a plurality of electronic switches. Each electronic switch can be configured to activate and deactivate one or more discrete capacitors.

As with the control circuit 45 of FIGS. 2-3, the control circuit 645 can also be connected to a driver circuit 639 and an RF choke and filter circuit 637. The control circuit 645, driver circuit 639, and RF choke and filter circuit 637 can have capabilities similar to those discussed with regard to FIG. 2-3. In the exemplified embodiment, the driver circuit 639 is operatively coupled between the control circuit 645 and the first and second capacitor arrays 651a, 651b. The driver circuit 639 is configured to alter the variable capacitance based upon a control signal received from the control circuit 645. The RF filter 637 is operatively coupled between the driver circuit 639 and the first and second capacitor arrays 651a, 651b. In response to the control signal sent by the control unit 645, the driver circuit 639 and RF filter 637 are configured to send a command signal to the command input 629. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 639 is configured to switch a high voltage source on or off in less than 15 μsec, the high voltage source controlling the electronic switches of each of the first and second capacitor arrays for purposes of altering the variable capacitance. The EVC 651, however, can be switched by any of the means or speeds discussed in the present application.

The control circuit 645 can be configured to calculate coarse and fine capacitance values to be provided by the respective capacitor arrays 651a, 651b. In the exemplified embodiment, the control circuit 645 is configured to calculate a coarse capacitance value to be provided by controlling the on and off states of the first capacitor array 651a. Further, the control circuit is configured to calculate a fine capacitance value to be provided by controlling the on and off states of the second capacitor array 651b. In other embodiments, the capacitor arrays 651a, 651b can provide alternative levels of capacitance. In other embodiments, the EVC can utilize additional capacitor arrays.

EVC 651 of FIG. 4 can be used in most systems requiring a varying capacitance. For example, EVC 651 can be used as the series EVC and/or shunt EVC in matching network 11 of FIG. 2, or as one or both of the shunt EVCs in matching network 11A of FIG. 3. It is often desired that the differences between the capacitance values allow for both a sufficiently fine resolution of the overall capacitance of the circuit and a wide range of capacitance values to enable a better impedance match at the input of a RF matching network, and EVC 651 allows this.

EVC 651 can also be used in a system or method for fabricating a semiconductor, a method for controlling a variable capacitance, and/or a method of controlling an RF impedance matching network. Such methods can include altering at least one of the series variable capacitance and the shunt variable capacitance to the determined series capacitance value and the shunt capacitance value, respectively. This altering can be accomplishing by controlling, for each of the series EVC and the shunt EVC, on and off states of each discrete capacitor of each plurality of discrete capacitors. In other embodiments, EVC 651 and circuit 650 can be used in other methods and systems to provide a variable capacitance.

Switching In and Out Discrete Capacitors to Vary EVC Capacitance

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of methods for setting up an EVC or other variable capacitor to provide varying capacitances.

In what is sometimes referred to as an "accumulative setup" of an EVC or other variable capacitor, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switched in, and the fine tune capacitors are switched out. The process starts over with increasing the number of fine tune capacitors that are switched into circuit, until all fine and coarse tune capacitors are switched in, at which point another coarse tune capacitor is switched in and the fine tune capacitors are switched out. This process can continue until all the coarse and fine capacitors are switched in.

In this embodiment, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance. The embodiments, however, are not so limited. The fine tune capacitors (and coarse capacitors) need not have the same or a substantially similar value. Further, the capacitance value of one coarse tune capacitor need not equal the combined capacitance value of all fine tune capacitors plus an additional fine tune capacitor. In one embodiment, the coarse capacitance value and the fine capacitance value have a ratio substantially similar to 10:1. In another embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

An example of the aforementioned embodiment in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system. According to the accumulative setup, increasing the total capacitance of a variable capacitor is achieved by switching in more of the coarse capacitors or more of the fine capacitors than are already switched in without switching out a coarse capacitor that is already switched in. Further, when the variable total capacitance is increased and the control circuit does not switch in more of the coarse capacitors than are already switched in, then the control circuit switches in more fine capacitors than are already switched in without switching out a fine capacitor that is already switched in.

Figure 5:
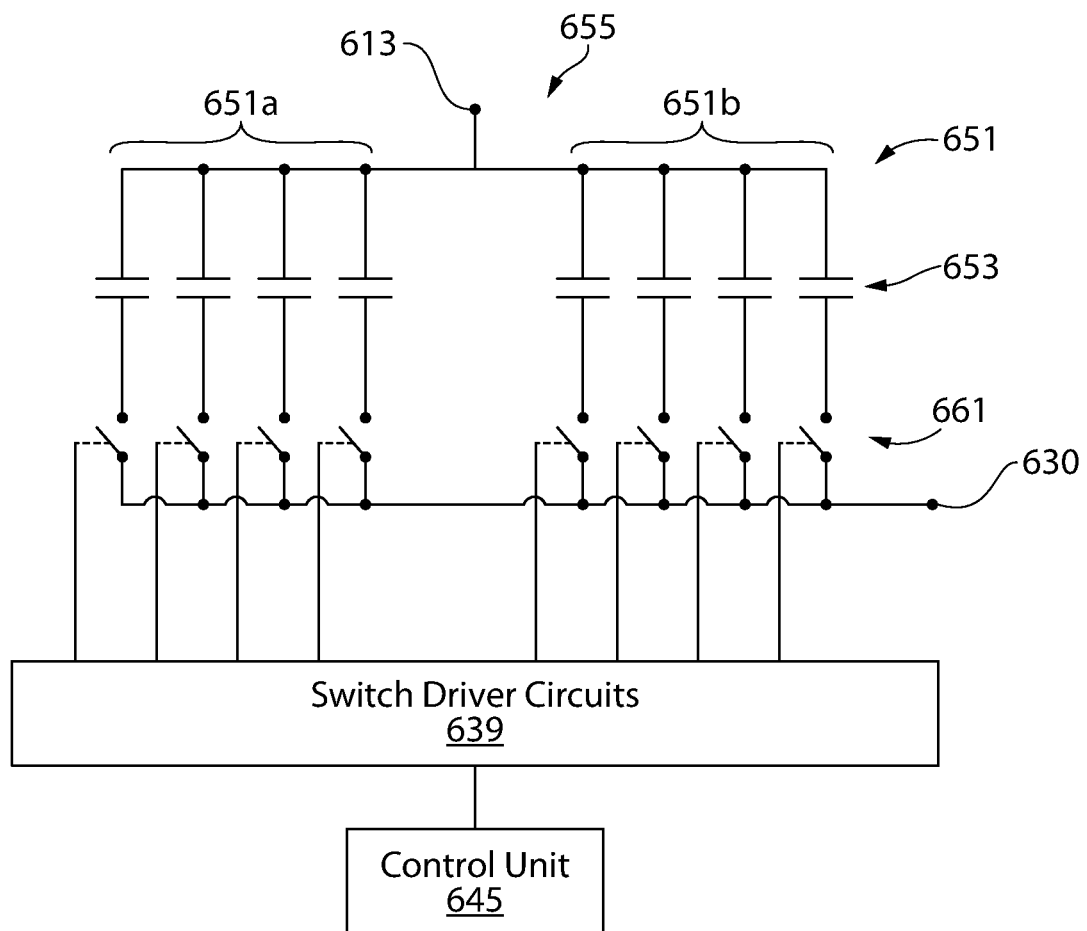
FIG. 5 is a block diagram of an embodiment of a variable capacitance system for switching in and out discrete capacitors of an electronically variable capacitor.

FIG. 5 is a schematic of a variable capacitance system 655 according to an accumulative setup. Where this figure uses reference numbers identical to those of FIG. 4, it is understood that the relevant components can have features similar to those discussed in FIG. 4. The variable capacitance system 655 comprises a variable capacitor 651 for providing a varying capacitance. The variable capacitor 651 has an input 613 and an output 630. The variable capacitor 651 includes a plurality of discrete capacitors 653 operably coupled in parallel. The plurality of capacitors 653 includes first (fine) capacitors 651*a* and second (coarse) capacitors 651B. Further, the variable capacitor 651 includes a plurality of switches 661. Of the switches 661, one switch is operably coupled in series to each of the plurality of capacitors to switch in and out each capacitor, thereby enabling the variable capacitor 651 to provide varying total capacitances. The variable capacitor 651 has a variable total capacitance that is increased when discrete capacitors 653 are switched in and decreased when the discrete capacitors 653 are switched out.

The switches 661 can be coupled to switch driver circuits 639 for driving the switches on and off. The variable capacitance system 655 can further include a control unit 645 operably coupled to the variable capacitor 651. Specifically, the control unit 645 can be operably coupled to the driver circuits 639 for instructing the driver circuits 639 to switch one or more of the switches 661, and thereby turn one or more of the capacitors 653 on or off. In one embodiment, the control unit 645 can form part of a control unit that controls a variable capacitor, such as a control unit that instructs the variable capacitors of a matching network to change capacitances to achieve an impedance match. The driver circuits 639 and control unit 645 can have features similar to those discussed above with reference to FIG. 4, and thus can also utilize an RF choke and filter as discussed above.

In one embodiment, the control circuit 645 is configured to determine a desired coarse capacitance for the coarse capacitors; determine a desired fine capacitance for the fine capacitors; and after calculating the desired coarse capacitance and the desired fine capacitance, alter the total variable capacitance by switching in or out at least one of the fine capacitors; and switching in or out at least one of the coarse capacitors. In other embodiments, coarse tuning and fine tuning can occur at different stages.

In the exemplified embodiment, the first capacitors 651*a* are fine capacitors each having a capacitance value substantially similar to a fine capacitance value, and the second capacitors 651*b* are coarse capacitors each having a capacitance value substantially similar to a coarse capacitance value, the coarse capacitance value being greater than the fine capacitance value. For purposes of this application, capacitances and other values are considered to be substantially similar if one value is not 15 percent (15%) greater than or less than another value.

The variable capacitance system 655 can form part of an impedance matching network, including but not limited to, the impedance matching networks of FIGS. 1-3. The variable capacitance system can also form part of a method for controlling an impedance matching network (such as the impedance matching networks of FIGS. 1-3). The method can include providing the RF impedance matching network comprising determining an increased total capacitance to be provided by one of the EVCs; and increasing the variable total capacitance of the one EVC by switching in more of the coarse capacitors or more of the fine capacitors than are already switched in without switching out a coarse capacitor that is already switched in. Further, the variable capacitance system can form part of a method and system for fabricating a semiconductor (see FIGS. 1-3).

Using the variable capacitance system discussed above with an impedance matching network can provide several advantages over other approaches. An alternative to the above approach would be to have all the capacitor values be different, with the first value equal to the minimum desired change in capacitance. Then each successive capacitor value is increased to double the change in capacitance from the previous up until the maximum desired capacitor value, when all capacitors are switched in. This approach can result in using less capacitors to switch in and out of circuit to achieve the same resolution and range. A potential problem with this setup, however, is that, once the capacitor reaches a certain value, the voltage and/or current on that particular capacitor or the current on the switch can be higher than the specification allows for. This forces the EVC to use multiple capacitors in parallel for each switch of lower value. This problem is particularly acute where high voltages and/or currents are being used. The accumulative setup discussed above avoids putting this degree of stress on its capacitors and switches by switching in additional capacitors, rather than replacing lower-capacitance capacitors with higher-capacitance capacitors.

Determining Capacitance Values to Achieve Match

Figure 6:
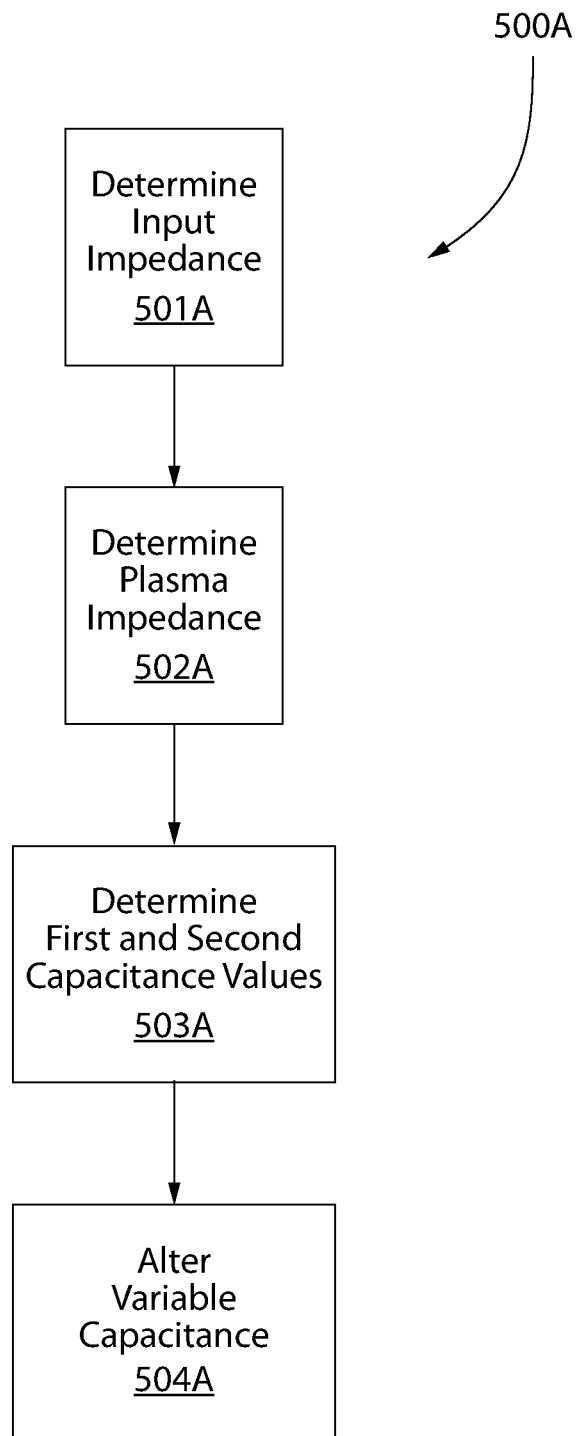
FIG. 6 is a flow chart showing an embodiment of a process for matching an impedance by altering a variable capacitance.

FIG. 6 is a flow chart showing a process 500A for matching an impedance according to one embodiment. The matching network can include components similar to those discussed above. In one embodiment, the matching network of FIG. 2 is utilized. In the first step of the exemplified process 500A of FIG. 6, an input impedance at the RF input 13 is determined (step 501A). The input impedance is based on the RF input parameter detected by the RF input sensor 21 at the RF input 13. The RF input sensor 21 can be any sensor configured to detect an RF input parameter at the RF input 13. The input parameter can be any parameter measurable at the RF input 13, including a voltage, a current, or a phase at the RF input 13. In the exemplified embodiment, the RF input sensor 21 detects the voltage, current, and phase at the RF input 13 of the matching network 11. Based on the RF input parameter detected by the RF input sensor 21, the control circuit 45 determines the input impedance.

Next, the control circuit 45 determines the plasma impedance presented by the plasma chamber 19 (step 502A). In one embodiment, the plasma impedance determination is based on the input impedance (determined in step 501A), the capacitance of the series EVC 31, and the capacitance of the shunt EVC 33. In other embodiments, the plasma impedance determination can be made using the output sensor 49 operably coupled to the RF output, the RF output sensor 49 configured to detect an RF output parameter. The RF output parameter can be any parameter measurable at the RF output 17, including a voltage, a current, or a phase at the RF output 17. The RF output sensor 49 may detect the output parameter at the RF output 17 of the matching network 11. Based on the RF output parameter detected by the RF output sensor 21, the control circuit 45 may determine the plasma impedance. In yet other embodiments, the plasma impedance determination can be based on both the RF output parameter and the RF input parameter.

Once the variable impedance of the plasma chamber 19 is known, the control circuit 45 can determine the changes to make to the variable capacitances of one or both of the series and shunt EVCs 31, 33 for purposes of achieving an impedance match. Specifically, the control circuit 45 determines a first capacitance value for the series variable capacitance and a second capacitance value for the shunt variable capacitance (step 503A). These values represent the new capacitance values for the series EVC 31 and shunt EVC 33 to enable an impedance match, or at least a substantial impedance match. In the exemplified embodiment, the determination of the first and second capacitance values is based on the variable plasma impedance (determined in step 502A) and the fixed RF source impedance.

Once the first and second capacitance values are determined, the control circuit 45 generates a control signal to alter at least one of the series variable capacitance and the shunt variable capacitance to the first capacitance value and the second capacitance value, respectively (step 504A). This is done at approximately t=−5 µsec. The control signal instructs the switching circuit to alter the variable capacitance of one or both of the series and shunt EVCs 31, 33.

This alteration of the EVCs 31, 33 takes about 9-11 µsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 µsec. Finally, the RF power profile 403 is shown decreasing, at just before t=56 µsec, from about 380 mV peak-to-peak to about 100 mV peak-to-peak. This decrease in the RF power profile 403 represents the decrease in the reflected power 407, and it takes place over a time period of about 10 µsec, at which point the match tune process is considered complete.

The altering of the series variable capacitance and the shunt variable capacitance can comprise sending a control signal to the series driver circuit 39 and the shunt driver circuit 43 to control the series variable capacitance and the shunt variable capacitance, respectively, where the series driver circuit 39 is operatively coupled to the series EVC 31, and the shunt driver circuit 43 is operatively coupled to the shunt EVC 43. When the EVCs 31, 33 are switched to their desired capacitance values, the input impedance may match the fixed RF source impedance (e.g., 50 Ohms), thus resulting in an impedance match. If, due to fluctuations in the plasma impedance, a sufficient impedance match does not result, the process of 500A may be repeated one or more times to achieve an impedance match, or at least a substantial impedance match.

Using an RF matching network 11, such as that shown in FIG. 2, the input impedance can be represented as follows:

$$Z_{in} = \frac{(Z_P + Z_L + Z_{series})Z_{shunt}}{Z_P + Z_L + Z_{series} + Z_{shunt}}$$

where $Z_{in}$ is the input impedance, $Z_P$ is the plasma impedance, $Z_L$ is the series inductor impedance, $Z_{series}$ is the series EVC impedance, and $Z_{shunt}$ is the shunt EVC impedance. In the exemplified embodiment, the input impedance ($Z_{in}$) is determined using the RF input sensor 21. The EVC impedances ($Z_{series}$ and $Z_{shunt}$) are known at any given time by the control circuitry, since the control circuitry is used to command the various discrete capacitors of each of the series and shunt EVCs to turn ON or OFF. Further, the series inductor impedance ($Z_L$) is a fixed value. Thus, the system can use these values to solve for the plasma impedance ($Z_P$).

Based on this determined plasma impedance ($Z_P$) and the known desired input impedance ($Z_{in}'$) (which is typically 50 Ohms), and the known series inductor impedance ($Z_L$), the system can determine a new series EVC impedance ($Z_{series}'$) and shunt EVC impedance ($Z_{shunt}'$).

$$Z_{in}' = \frac{(Z_P + Z_L + Z_{series}')Z_{shunt}'}{Z_P + Z_L + Z_{series}' + Z_{shunt}'}$$

Based on the newly calculated series EVC variable impedance ($Z_{series}'$) and shunt EVC variable impedance ($Z_{shunt}'$), the system can then determine the new capacitance value (first capacitance value) for the series variable capacitance and a new capacitance value (second capacitance value) for the shunt variable capacitance. When these new capacitance values are used with the series EVC 31 and the shunt EVC 33, respectively, an impedance match may be accomplished.

The exemplified method of computing the desired first and second capacitance values and reaching those values in one step is significantly faster than moving the two EVCs step-by-step to bring either the error signals to zero, or to bring the reflected power/reflection coefficient to a minimum. In semiconductor plasma processing, where a faster tuning scheme is desired, this approach provides a significant improvement in matching network tune speed.

Determining Capacitance Values Using Parameter Matrix

Figure 7:
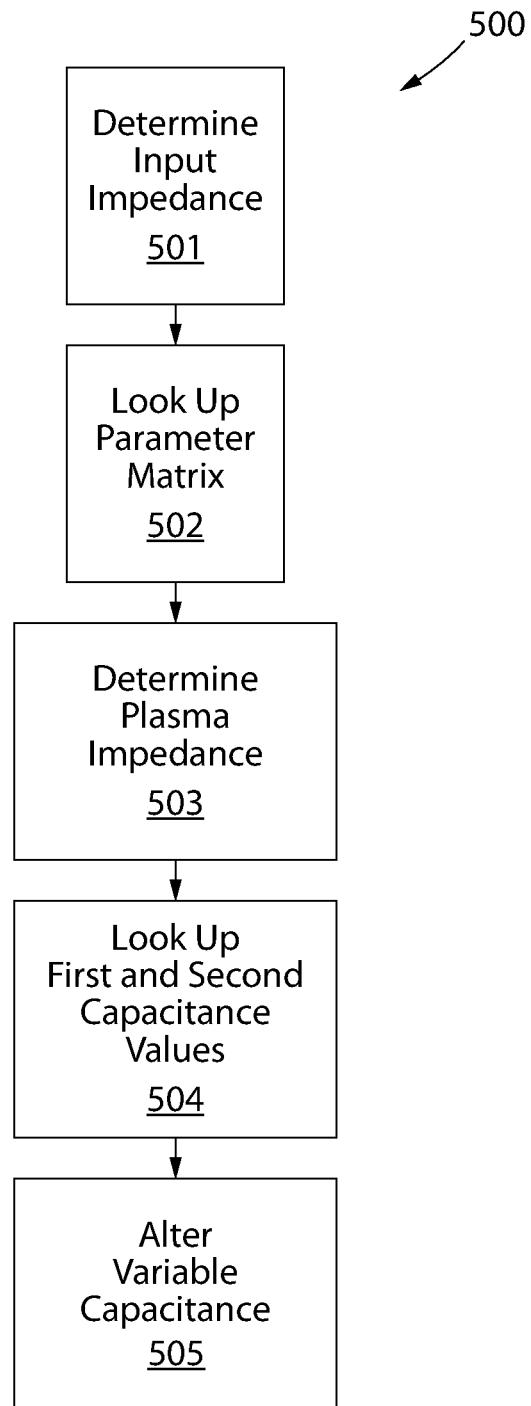
FIG. 7 is a flow chart showing another embodiment of a process for matching an impedance using a parameter matrix to alter a variable capacitance.

FIG. 7 provides an alternative process 500 for matching an impedance that uses a parameter matrix. In the exemplified process, the control circuit 45 (see FIG. 2 for matching network components) is configured and/or programmed to carry out each of the steps. As one of two initial steps, RF parameters are measured at the RF input 13 by the RF input sensor 21, and the input impedance at the RF input 13 is calculated (step 501) using the measured RF parameters. For this exemplified process 500, the forward voltage and the forward current are measured at the RF input 13. In certain other embodiments, the RF parameters may be measured at the RF output 17 by the RF output sensor 49, although in such embodiments, different calculations may be required than those described below. In still other embodiments, RF parameters may be measured at both the RF input 13 and the RF output 17.

The impedance matching circuit, coupled between the RF source 15 and the plasma chamber 19, may be characterized by one of several types of parameter matrices known to those of skill in the art, including two-port parameter matrices. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network. The second initial step of the exemplified process 500 is to look up (step 502) the parameter matrix for the existing configuration of the impedance matching circuit in a parameter lookup table. The existing configuration of the impedance matching circuit is defined by existing operational parameters of the impedance matching circuit, particularly the existing array configurations for both of the series EVC 31 and the shunt EVC 33. In order to achieve an impedance match, the existing configuration of the impedance matching circuit is altered to a new configuration of the impedance matching circuit as part of the exemplified process 500.

The parameter lookup table includes a plurality of parameter matrices, with each parameter matrix being associated with a particular configuration of the series EVC 31 and the shunt EVC 33. The parameter lookup table may include one or more of the aforementioned types of parameter matrices. In the exemplified process 500, the parameter lookup table includes at least a plurality of S-parameter matrices. In certain embodiments, the parameter lookup table may include at least a plurality of Z-parameter matrices. In embodiments in which the parameter lookup table includes multiple types of parameter matrices, the different types of parameter matrices are associated within the parameter lookup table in such a way so as to eliminate the need for mathematical conversions between the different types of parameter matrices. For example, the T-parameter matrix may be included as part of the parameter lookup table, with each T-parameter matrix associated with the associated S-parameter matrix that would result from conversion between the two matrices.

The input impedance calculation (step 501) and the parameter matrix look up (step 502) may be performed in any order. With the input impedance calculated (step 501) and the parameter matrix for the existing configuration of the impedance matching circuit identified within the parameter lookup table (step 502) done, the plasma or load impedance may then be calculated (step 503) using the calculated input impedance and the parameter matrix for the existing configuration. Next, from the calculated plasma impedance, the match configurations for the series EVC 31 and the shunt EVC 33 that would achieve an impedance match, or at least a substantial impedance match, between the RF source 15 and the plasma chamber 19 are looked up (step 504) in an array configuration lookup table. These match configurations from the array configuration lookup table are the array configurations which will result in new capacitance values for the series EVC 31 and shunt EVC 33, with an impedance match being achieved with the new array configurations and associated new capacitance values. The array configuration lookup table is a table of array configurations for the series EVC 31 and the shunt EVC 33, and it includes each possible array configuration of the series EVC 31 and the shunt EVC 33 when used in combination. As an alternative to using an array configuration lookup table, the actual capacitance values for the EVCs 31, 33 may be calculated during the process—however, such real-time calculations of the capacitance values are inherently slower than looking up the match configurations in the array configuration lookup table. After the match configurations for the series EVC 31 and the shunt EVC 33 are identified in the array configuration lookup table, then one or both of the series array configuration and the shunt array configuration are altered (step 505) to the respective identified match configurations for the series EVC 31 and the shunt EVC 33.

The altering (step 505) of the series array configuration and the shunt array configuration may include the control circuit 45 sending a control signal to the series driver circuit 39 and the shunt driver circuit 43 to control the series array configuration and the shunt array configuration, respectively, where the series driver circuit 39 is operatively coupled to the series EVC 31, and the shunt driver circuit 43 is operatively coupled to the shunt EVC 43. When the EVCs 31, 33 are switched to the match configurations, the input impedance may match the fixed RF source impedance (e.g., 50 Ohms), thus resulting in an impedance match. If, due to fluctuations in the plasma impedance, a sufficient impedance match does not result, the process of 500 may be repeated one or more times to achieve an impedance match, or at least a substantial impedance match.

The lookup tables used in the process described above are compiled in advance of the RF matching network being used in conjunction with the plasma chamber 19. In creating the lookup tables, the RF matching network 11 is tested to determine at least one parameter matrix of each type and the load impedance associated with each array configuration of the series EVC 31 and the shunt EVC 33 prior to use with a plasma chamber. The parameter matrices resulting from the testing are compiled into the parameter lookup table so that at least one parameter matrix of each type is associated with a respective array configuration of the EVCs 31, 33. Similarly, the load impedances are compiled into the array configuration lookup table so that each parameter matrix is associated with a respective array configuration of the EVCs 31, 33. The pre-compiled lookup tables may take into consideration the fixed RF source impedance (e.g., 50 Ohms), the power output of the RF source, and the operational frequency of the RF source, among other factors that are relevant to the operation of the RF matching network. Each lookup table may therefore have tens of thousands of entries, or more, to account for all the possible configurations of the EVCs 31, 33. The number of possible configurations is primarily determined by how many discrete capacitors make up each of the EVCs 31, 33. In compiling the lookup tables, consideration may be given to possible safety limitations, such as maximum allowed voltages and currents at critical locations inside the matching network, and this may serve to exclude entries in one or more of the lookup tables for certain configurations of the EVCs 31, 33.

As is known in the art, the S-parameter matrix is composed of components called scatter parameters, or S-parameters for short. An S-parameter matrix for the impedance matching circuit has four S-parameters, namely $S_{11}$, $S_{12}$, $S_{21}$, and $S_{22}$, each of which represents a ratio of voltages at the RF input 13 and the RF output 17. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely $Z_{11}$, $Z_{12}$, $Z_{21}$, and $Z_{22}$.

By compiling the parameter lookup table in this manner, the entire time cost of certain calculations occurs during the testing phase for the RF matching network, and not during actual use of the RF matching network 11 with a plasma chamber 19. Moreover, because locating a value in a lookup table can take less time than calculating that same value in real time, using the lookup table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

From the beginning of the match tune process, which starts with the control circuit determining the variable impedance of the plasma chamber and determining the series and shunt match configurations, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the array configurations of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 µsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 µsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 µsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
|---|---|---|
| Capacitance | 20 pF~1400 pF | 15 pF~1000 pF |
| Reliability | High | Low |
| Response Time | ~500 µsec | 1 s~2 s |
| ESR | ~13 mW | ~20 mW |
| Voltage | 7 kV | 5 kV |
| Current Handling Capability | 216 A rms | 80 A rms |
| Volume | 4.5 in$^3$ | 75 in$^3$ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.

The EVC has a compact size as compared to a VVC, so that the reduced weight and volume may save valuable space within a fabrication facility.

The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.

The short match tune process (~500 µsec or less) allows the RF impedance matching network to better keep up with plasma changes within the fabrication process, thereby increasing plasma stability and resulting in more controlled power to the fabrication process.

The use of EVCs, which are digitally controlled, non-mechanical devices, in an RF impedance matching network provides greater opportunity to fine tune control algorithms through programming.

EVCs exhibit superior low frequency (kHz) performance as compared to VVCs.

Altering Frequency of RF Source to Fine Tune Match

Figure 8:
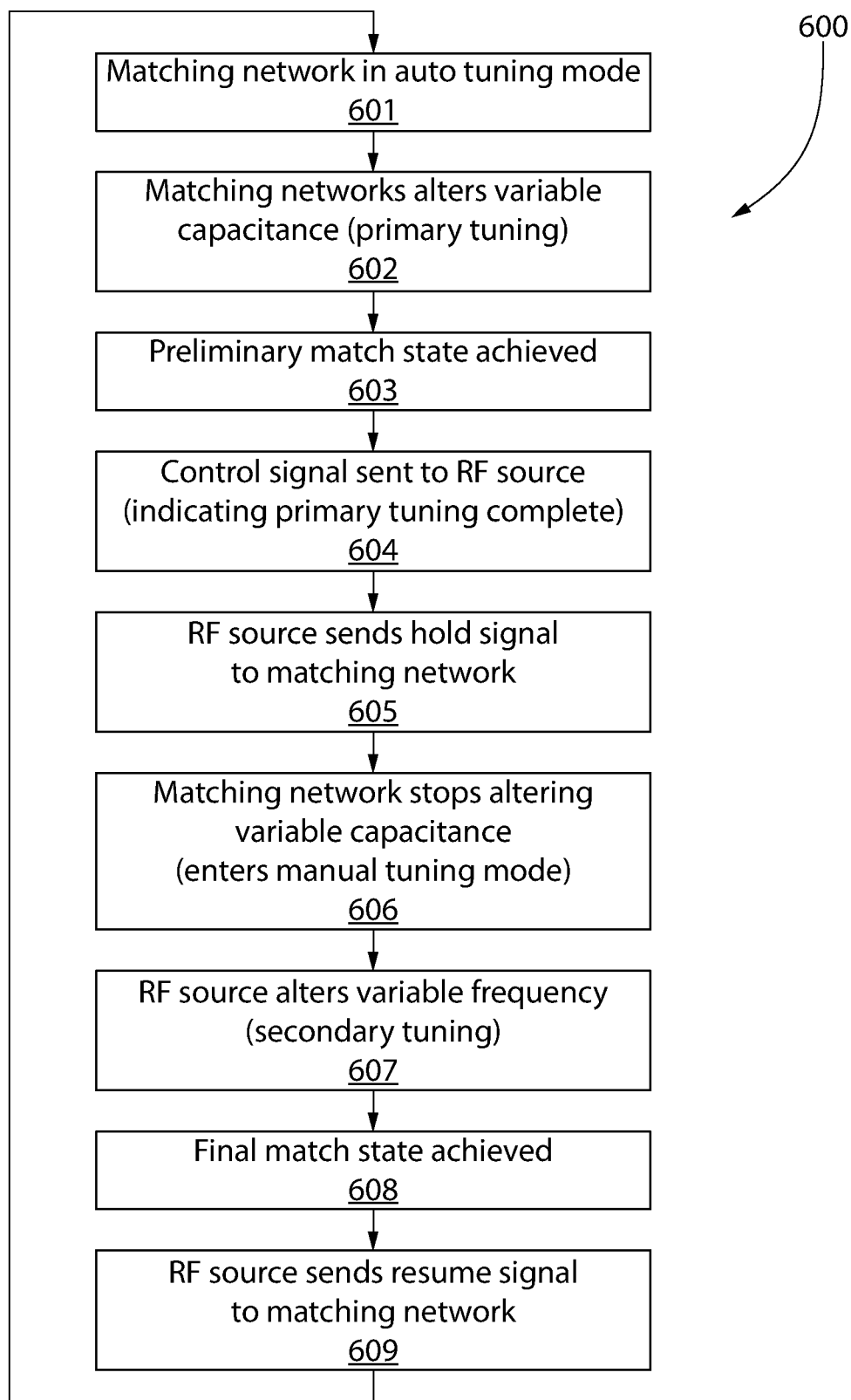
FIG. 8 is a flow chart showing another embodiment of a process for matching an impedance where a frequency of an RF source is also altered.

FIG. 8 is a flow chart showing a process 600 for matching an impedance according to another embodiment. Since EVCs can provide only discretized capacitance values, a matching network that varies only EVCs to create an impedance match can only match based on these discretized values. For example, if a plasma impedance occurs such that the series and/or shunt capacitance values needed to bring the input impedance of the matching network to a desired non-reactive 50 Ohms lies in-between the discretized values, the EVC-based matching network will not be able to tune the input impedance of the matching network to the non-reactive 50 Ohms. The process 600 of FIG. 8 addresses such a circumstance by also altering a frequency of the RF source (sometimes referred to as the "RF generator") to carry out the impedance match.

The RF source, matching network, and plasma chamber of process 600 can be configured similarly to the system of FIG. 2. Accordingly, reference will be made to the components of the system of FIG. 2, though this figure represents just one embodiment of the invention.

As with previously discussed embodiments, the matching network 11 of process 600 can include an RF input 13 configured to receive an RF signal from an RF source 15, and an RF output 17 configured to operably couple to a plasma chamber 19. The matching network can further include at least one EVC 31, 33, and a control circuit 45 for instructing the at least one EVC 31, 33 to alter its variable capacitance. The RF source 15 (including its control circuitry) and the RF matching network 11 can be in the same enclosure or separate enclosures.

In the process 600, the matching network 11 is initially in an auto tuning mode (step 601). In this mode, the matching network 11 can be configured to carry out automated tuning by altering at least one capacitance value in a manner similar to that described in the foregoing embodiments. In this mode, the process 600 performs tuning referred to as primary tuning (step 602). In the exemplified embodiment, the primary tuning includes altering the series and/or shunt capacitance values in an attempt to achieve an impedance match. In the exemplified embodiment, the desired input impedance (the desired impedance at the input of the matching network 11) is a fixed, non-reactive 50 Ohm, sometimes referred to as the RF source impedance. In other embodiments, the desired input impedance can be any other impedance value, and can be variable.

In the exemplified embodiment, the primary tuning will bring the input impedance relatively close to a non-reactive 50 Ohms, the matching network 11 being limited by the discretized capacitance values of the EVCs 31, 33. At this stage, a preliminary match is achieved (step 603). The preliminary match state will have an associated first reflection parameter value at the RF source output 15a (the RF source output 15a being connected to the matching network input 13). In the exemplified embodiment, the first reflection parameter value is a reflected power value. In other embodiments, the first reflection parameter value can be any reflection-related parameter associated with the preliminary match state. For example, the first reflection parameter value can be the reflection coefficient, which represents the ratio of the amplitude of the reflected wave to the incident wave, and is sometimes referred to as gamma. The first reflection parameter can be measured by sensor 21 at the RF source output 15a. In other embodiments, reflected power can be measured by a sensor or comparable device that is located proximate to the matching network input 13.

In one embodiment, the alteration of variable capacitance in auto tuning mode can include the steps of adjusting the variable capacitance, determining an intermediate reflection parameter value, and then reducing and/or increasing the variable capacitance based on the intermediate reflection parameter value. This process can be repeated such that there are several intermediate reflection parameter values, the adjustment of the one or more variable capacitances being based on these intermediate reflection parameter values. In other embodiments, the invention can omit the use of intermediate reflection parameter values.

Once the preliminary match state is achieved, the matching network 11 can provide a control signal to the RF source 15 indicating that primary tuning is complete and that a preliminary match has been achieved (step 604). The control signal can be any signal sufficient to provide indication that the preliminary match has been achieved.

In response, the RF source 15 can send a hold signal to the matching network 11 (step 605), the hold signal placing the matching network 11 in a manual tuning mode (step 606). In manual tuning mode, the matching network 11 will stop performing automated tuning (and therefore will not alter the variable capacitances) as long as the hold signal is present. In other embodiments, the matching network 11 can automatically enter manual tuning mode when the preliminary match has been achieved, and can return to auto tuning mode when receiving an instruction from the RF source 15.

Next, the variable frequency of the RF source 15 can be adjusted to perform secondary tuning (step 607). This secondary tuning can fine tune the input impedance of the matching network 1 to the desired non-reactive 50 Ohm, or other desired impedance, and can minimize the reflected power at the output of the RF source 15, thereby also decreasing the reflection coefficient. The RF source 15 can have standard control circuitry by which the frequency is varied and the signals discussed above are sent, received, and processed. The frequency can be altered by providing a command to a frequency generation circuit that forms part of the RF source, such as a Direct Digital Synthesizer.

Once the RF source 15 has completed altering the frequency for the secondary tuning, a final match state is achieved (step 608). The final match state will have an associated second reflection parameter value at the RF source output 15a. As with the first reflection parameter value, in the exemplified embodiment, the second reflection parameter value is a reflected power value. In other embodiments, the second reflection parameter value can be any reflection-related parameter associated with the preliminary match state, such as the reflection coefficient (discussed above). The second reflection parameter can be measured by a sensor 21 at the RF source output 15a. Since the final match state causes a more finely tuned match than the preliminary match state, the second reflection parameter value will be less than the first reflection parameter value.

The alteration of the variable RF source frequency can include reducing and/or increasing the variable RF source frequency based on an intermediate reflection parameter value. In one embodiment, the alteration of the variable source frequency includes reducing the variable RF source frequency by a first amount and determining the intermediate reflection parameter value at the RF source output. If the intermediate reflection parameter value decreases, the variable RF source frequency is again reduced by the first amount and a new intermediate reflection parameter value is measured. This process can repeat until the intermediate reflection parameter value increases. When the intermediate reflection parameter value increases, the variable source frequency can be increased by a second amount (the second amount being less than the first amount), and then a new intermediate reflection parameter value is determined. If the new intermediate reflection parameter value decreases, the variable source frequency is again increased by the second amount, and a new intermediate reflection parameter value is determined. This process can repeat until the new intermediate reflection parameter value increases or is zero, at which stage the process can stop or the variable source frequency can be returned to its previous value.

The invention is not limited to any one embodiment for tuning the frequency or variable capacitance. For example, the invention can use any variety of methods to step up and/or down the frequency in different increments based on the resulting reflected power. Further, the process 600 can have a minimum reflected parameter value (e.g., a minimum reflected power or minimum reflection coefficient). When the minimum reflected parameter value is achieved, the tuning can stop, regardless of whether the process is in primary or secondary tuning.

Returning to the exemplified embodiment, once the final match state is achieved, the RF source 15 can send a signal (sometimes referred to as a "resume signal") to the matching network 11 to place the matching network 11 back into auto tuning mode (step 609). The matching network 11 can then be ready for the next variation of the plasma impedance. Thus, when a plasma impedance of the plasma chamber 15 changes, the control circuit 45 can repeat the instruction to alter the variable capacitance and/or the instruction to alter the variable RF source frequency.

In other embodiments, the process 600 will not resume tuning until the reflection parameter value exceeds a predetermined value. Such a tuning restart threshold can be applied to the primary tuning, the secondary tuning, or both. Further, thresholds can be set such that, for small reflected power level raises, only secondary tuning is done (altering the RF source frequency), while, for larger reflected power levels, primary tuning is first carried out (altering capacitances), followed by secondary tuning (altering the RF source frequency).

Combining an EVC-based RF matching network with a variable frequency RF source provides several advantages for fast and precise RF matching. For example, with all components being electronic, the system has higher reliability than those using VVC technology, which are prone to mechanical failures. Further, the primary and second tuning can be performed quickly to enable matching within 500 μsec. Further, the combined EVC matching network and variable RF source can decrease the reflected power to the RF source to essentially 0 Watts.

Restricted Capacitor Switching

The matching networks discussed above can alter their variable capacitance values to achieve an impedance match. This process is sometimes referred to as tuning. The state of the impedance matching can be assessed based on a reflection parameter value. In the exemplified embodiments, the reflection parameter value is a reflected power value. More specifically, the reflection parameter value is a reflection coefficient value (sometimes referred to as "gamma"), which represents the ratio of the amplitude of a reflected wave to an incident wave. Referring to the system 85 of FIG. 2, the reflection parameter value can be measured by sensor 21 at the matching network input 13 (or RF source 15 output), or by sensor 49 at the matching network output 17 (or plasma chamber 19 input). Such a sensor can provide a signal to the control circuit 45 indicative of the reflection parameter value. In other embodiments, the reflection parameter value can be any reflection-related parameter associated with a match state.

In one approach to achieving an impedance match, a matching algorithm requires the control loop of the RF matching network to continue to tune until the reflection coefficient value at the input of the matching network is reduced below a certain level. This level is sometimes referred to as "gamma-stop." If the load impedance changes, the reflection coefficient at the input of the RF matching network can increase. If this reflection coefficient increases beyond a certain reflection coefficient value, sometimes referred to as "gamma-restart," then the RF matching network starts to tune again. In a solid-state RF matching network, there are typically no restrictions on how many switches can switch ON or OFF at any time, therefore based on the change in the reflection coefficient, the number of switches switching at any time can be significant and thus can result in perturbing the plasma to make it unstable.

In an alternative approach, an intermediate gamma value is utilized such that there are three gamma values: (1) a first reflection value (gamma-stop) at which tuning is stopped, (2) a second reflection value (gamma-restart-low) at which capacitor switching is limited, and (3) a third reflection value (gamma-restart-high) at which capacitor switching is unlimited.

Figure 9:
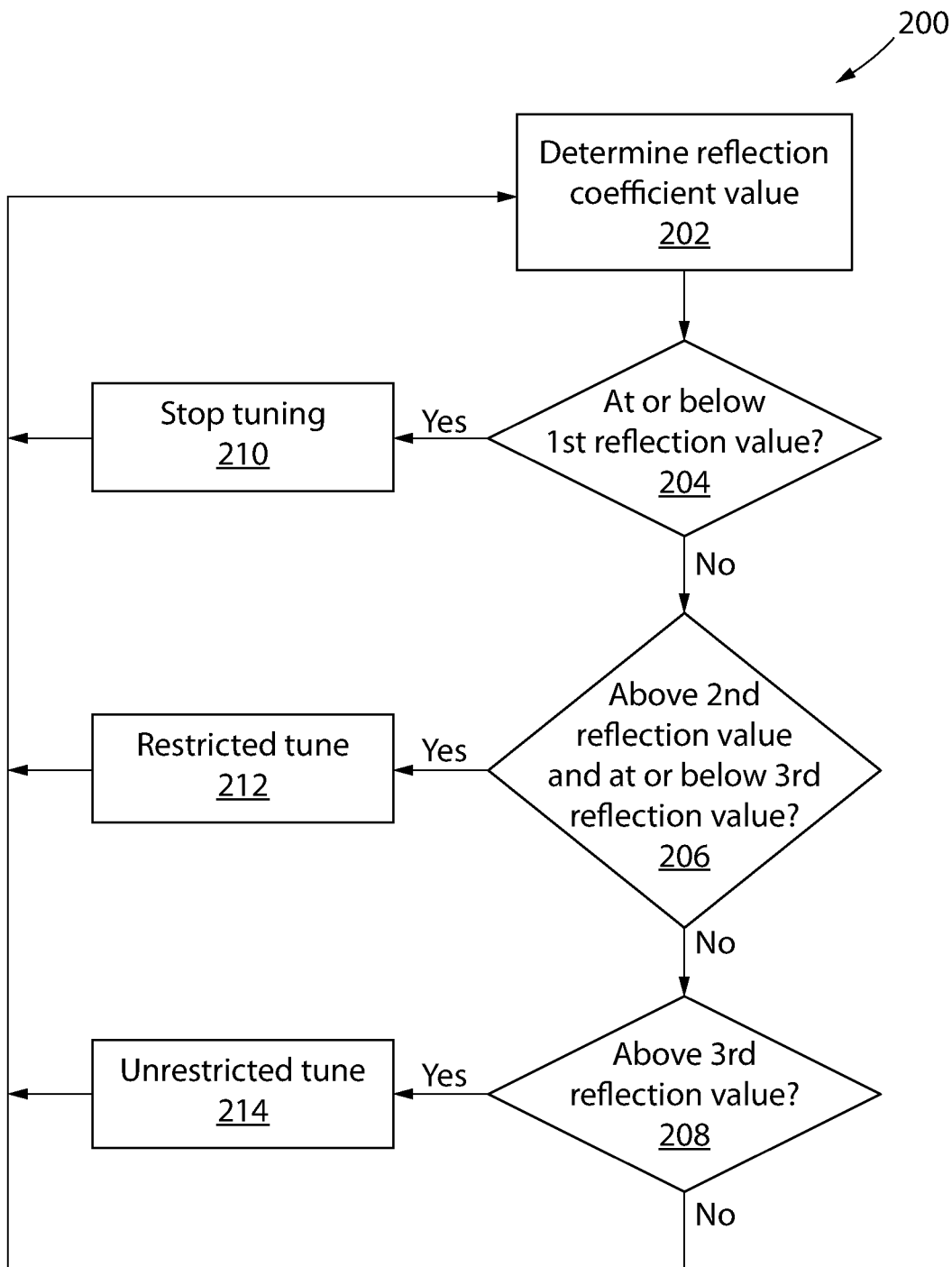
FIG. 9 is a flow chart showing another embodiment of a process for matching an impedance where capacitor switching can be restricted.

FIG. 9 is flow chart showing a process for matching an impedance where capacitor switching can be restricted using the above reflection values. In the exemplified embodiment, the reflection coefficient value is continuously monitored (operation 202). When the match is tuned and the reflection coefficient value (gamma) is not above the first reflection value (operation 204), no capacitors switch (operation 210). When the reflection coefficient value goes above the second reflection value (but is at or below the third reflection value) (operation 206), only a predetermined number of predetermined fine capacitors can switch at this time (restricted tune) (operation 212). Whether to turn these switches ON or OFF will depend upon what was the actual calculated position of the capacitors. When the reflection coefficient value goes above the third reflection value (operation 208), the capacitors can switch without any restrictions (unrestricted tune) (operation 214). For the purpose of this description, the fine capacitors can be any capacitors that are used to provide finer capacitance movement steps than the coarse capacitors.

In one embodiment, the coarse capacitors have a capacitance at least twice as large as the capacitance of the fine capacitors.

In one example, the predetermined number is two (only two capacitors can switch when the reflection coefficient value initially exceeds the second reflection value), and the three reflection values are as follows: (1) first reflection value (gamma-stop)=0.031, (2) second reflection value (gamma-restart-low)=0.07, (3) third reflection value (gamma-restart-high)=0.10. In this example, the matched position is C4F5/C6F7 (i.e., 4 coarse capacitor switches ON and 5 fine capacitor switches ON for one solid state capacitor array, and 6 coarse capacitor switches ON and 7 fine capacitor switches ON for the second solid state capacitor array), and this positioning is determined before determining how to switch the discrete capacitors.

If the reflection coefficient value is calculated as 0.08, and the new tuned position is calculated to be C3F0/C7F1, then the match will go to C4F3/C6F9, rather than going directly to C3F0/C7F1. The control circuit can continuously monitor the reflection coefficient value (or other reflection parameter), and thus this loop can run as many times as needed until either the reflection coefficient value goes below the first reflection value or the reflection coefficient value goes above the third reflection value. If the reflection coefficient value goes above the third reflection value (i.e., 0.10), then the capacitor switches are not restricted and can directly switch to the calculated position. Note that the foregoing capacitor restrictions can also be applied to when the match is moving from a higher reflection coefficient value to a lower reflection coefficient value to provide a slower settling profile. Not also, while the embodiment described above discusses altering the tuning based on whether a reflection parameter is above, or at, or below a reflection parameter (or some combination thereof), other embodiments can use any one of these options (or a combination of options) provided different values are used as reference values for determining what type of tuning to use. For example, in one embodiment the system can carry out an unrestricted tune when the reflection parameter is above the third reflection value, while in another embodiment the system can carry out an unrestricted tune when the reflection parameter is at or above the third reflection value.

By the above multi-step reflection value approach, if something changes in the process that changes the impedance by a significant amount, then the match can respond faster, but if the change is small, then the match will not take big steps to cause the plasma to become unstable. This restricted capacitor switching approach can be used, for example, with the matching networks discussed above. A control circuit, such as control circuit 45 or 645 can be used to carry out the steps of determining or receiving the reflection parameter value and controlling the altering of the discrete capacitors based on that value. It is further noted that the restricted capacitor approach described above can be used in conjunction with the other impedance matching and capacitor-switching methods discussed herein. Further, the restricted capacitor switching approach can be used with a matching network that forms part of a semiconductor processing tool, such as that shown in FIGS. 1-3. Further, the restricted capacitor switching approach can be used with a matching network as part of a method of manufacturing a semiconductor.

Matching Using EVC and Frequency

In yet another embodiment, impedance matching can be carried out using an EVC and frequency considerations. According to one embodiment, a single EVC is used. For example, in FIG. 3, capacitor 33A can be an EVC, while capacitor 31A can be non-variable. (In other embodiments, more than one capacitor in the matching network can be variable.) The matching network can be calibrated such that post-calibration, at least one of the lookup tables (such as the lookup tables discussed above) contains information to provide the best combination of capacitor position and frequency for a load impedance to get the lowest input reflected power or input reflection coefficient (input gamma).

During operation, in one embodiment the matching network determines the input impedance based on the information provided by an input RF sensor, such as a VI (voltage-current) sensor located at the RF input of the matching network. The matching network then uses this input impedance information and the current EVC configuration (e.g., capacitor switch positions) and the frequency information to calculate the plasma chamber (load) impedance. Alternatively, rather than calculating the load impedance from input impedance and the calibration parameters of the match, the load impedance can be directly measured from an output sensor at the RF output of the matching network.

In the next step of this embodiment, the matching network uses the determined load impedance and the match lookup table to determine the new EVC configuration and the new frequency that would provide the lowest reflected power or lowest input reflection coefficient at the RF input for enabling an impedance match. Such an approach provides a much faster means for tuning compared to linearly changing the capacitor switch positions and frequency based on the polarity and magnitude of the input error signal.

When the matching network is coupled to a plasma chamber and operating, the RF source (e.g., an RF generator) or the customer's system can provide the matching network with the frequency signal through some communication port (e.g., analog). Alternately, the matching network can detect the frequency at its RF input port. Based on this specific frequency, the matching network can use the lookup table to determine what EVC configuration, for that frequency, provides the lowest input reflected power or input reflection coefficient (gamma) for enabling an impedance match. The matching network's control circuit can then choose this EVC position and command the discrete switches of the EVC to switch the EVC to this new configuration providing a new capacitance.

In another embodiment, the matching network can determine the best EVC configuration and frequency combination to provide the lowest input reflected power or input reflection coefficient (gamma). The matching network's control circuit can then move the EVC to the new configuration (e.g., desired switch positions) and at the same time command the RF generator to move to the desired frequency. For example, this method can use EVC technology for the EVC and frequency tuning for the other leg and make an 'L' or 'pi' type of match for higher power operation, up to 6 or 10 kW.

Returning to FIG. 3, this semiconductor processing system 85A can be understood as carrying out one or more of the embodiments discussed above. The matching network 11A has an input 13 coupled to an RF source 15 having a variable frequency, and an output coupled to a plasma chamber 19 having a variable chamber impedance. The matching network 11A further includes two capacitors, where capacitor 33A may be an EVC and capacitor 31A may be non-variable. The matching network 11A has a control circuit 45 coupled to at least one of sensors 21 and sensor 49, the one or more sensors configured to detect an RF parameter. The control circuit may use a match lookup table (such as one of the lookup tables discussed above) with a value based on the detected RF parameter to determine a match combination. The match combination includes both a new EVC configuration for providing a new EVC capacitance, and a new source frequency for the RF source. Once these determinations have been made, the control circuit 45 can alter the EVC 33A to the new EVC configuration (and thus provide a new capacitance) and alter the variable frequency of the RF source to the new source frequency.

In other embodiments, the match combination may instead be only a new EVC configuration, where the lookup table bases this configuration on the current frequency being provided by the RF source. In such an embodiment, the RF source may be controlled by a separate second control circuit 16.

In the exemplified embodiment, the value based on the detected RF parameter (used with the match lookup table) is the variable chamber impedance. In other embodiments, the RF parameter can be any RF parameter associated with the matching network or processing system. For example, the RF parameter may be detected at the RF input 13 (by sensor 21) or at the RF output 17 (by sensor 49). In some embodiments, the value based on the detected RF parameter can be the detected RF parameter itself.

In the exemplified embodiment, the EVC comprises discrete capacitors having different configurations defining ON and OFF states of the discrete capacitors, these different configurations causing the EVC to provide different capacitances. For example, each discrete capacitor may have a corresponding switch to activate or deactivate the discrete capacitor, the EVC being altered to a new EVC configuration by the switches activating or deactivating at least one of the discrete capacitors of the EVC. The corresponding switch may be in series with or parallel to the discrete capacitor.

In one embodiment, prior to an impedance match, the EVC has a first configuration defining ON and OFF states of the discrete capacitors, and the variable frequency of the RF source has a first frequency. The control circuit determines, based on the detected RF parameter, an input impedance at the RF input of the matching network. The control circuit then determines the variable chamber impedance from a parameter matrix lookup table using (1) the determined input impedance of the impedance matching network; (2) the first configuration of the EVC; and (3) the first frequency of the RF source. The control circuit then uses the determined variable chamber impedance with the match lookup table to determine the match combination. The sensor may be a voltage and current sensor positioned at the RF input of the matching network. Further, the parameter matrix lookup table may include two-port parameter matrices, such as S-parameter matrices or Z-parameter matrices.

In another embodiment, the RF sensor 21 is a phase or magnitude detector operably coupled to the RF input 13 of the matching network 11A, and the detected RF parameter used for the determination of the match combination is a phase error or a magnitude error. In another embodiment, the RF sensor is operably coupled to the RF input of the matching network, and the detected RF parameter is at least one of a voltage, a current, or a phase at the RF input. Further, the determination of the match combination may use the match lookup table with a reflection coefficient based on the at least one of the voltage, the current, or the phase, the reflection coefficient being the value based on the detected RF parameter. In yet another embodiment, the RF sensor 49 is operably coupled to the RF output 17 of the matching network, and the determination of the match combination uses the match lookup table with a load impedance based on the RF parameter detected by the RF sensor at the RF output.

Figure 10:
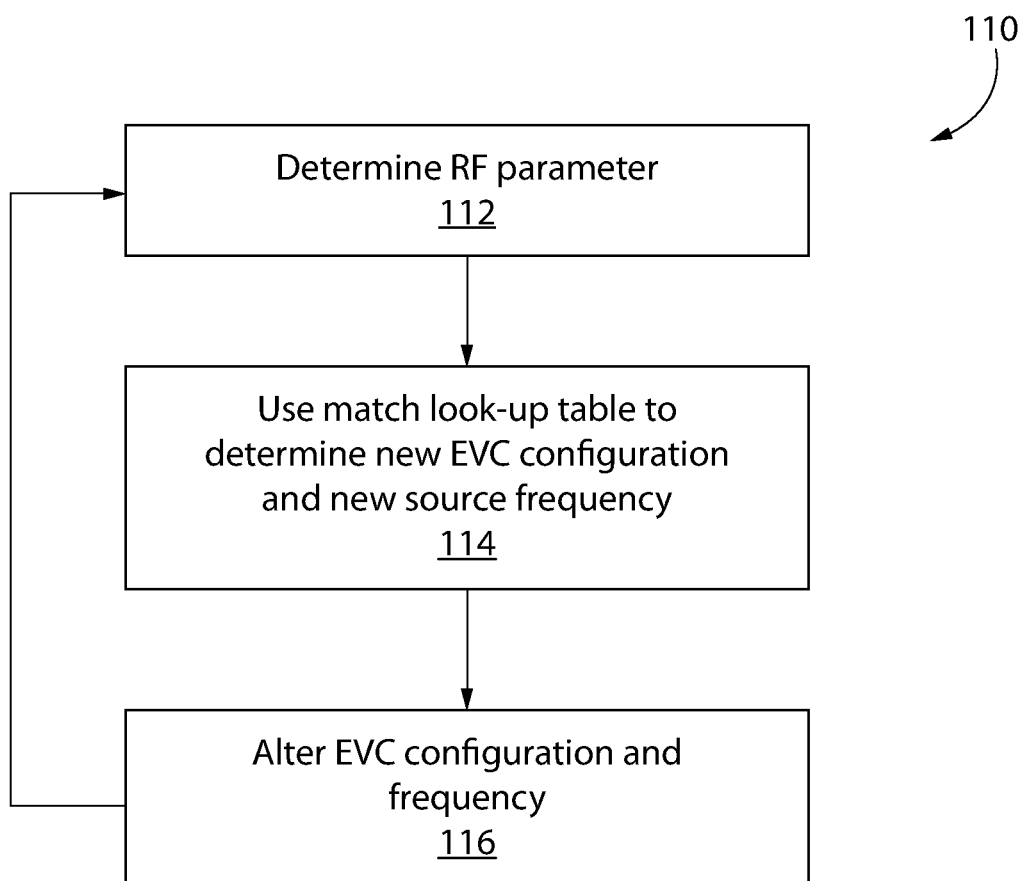
FIG. 10 is a flow chart showing an embodiment of a process for matching an impedance using a lookup table to alter an EVC configuration and an RF source frequency.

FIG. 10 is a flow chart showing an embodiment of a process 110 for matching an impedance using a lookup table to alter an EVC configuration and an RF source frequency. In a first step, the sensor detects an RF parameter (step 112). To cause an impedance match between the RF source and the plasma chamber, the control circuit determines, using a match lookup table with value based on the detected RF parameter, a match combination of a new EVC configuration for providing a new EVC capacitance, and a new source frequency for the RF source (step 114). The control circuit then alters the EVC to the new EVC configuration, and alters the variable frequency of the RF source to the new source frequency (step 116).

The above process may be carried out as part of a method of manufacturing a semiconductor. Such a manufacturing method may include placing a substrate in the plasma chamber configured to deposit a material layer onto the substrate or etch a material layer from the substrate; and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

Matching Using Independent EVC and Frequency Control

In yet another embodiment, impedance matching can be carried out using an EVC and frequency considerations where the EVC and the frequency are controlled separately. According to one embodiment, a single EVC is used. For example, in FIG. 3, capacitor 33A can be an EVC, while capacitor 31A can be non-variable. In other embodiments, more than one capacitor in the matching network can be variable, or capacitor 31A can be eliminated. The matching network can be calibrated such that post-calibration, at least one of the lookup tables (such as the lookup tables discussed above) contains information to provide the best capacitor positions for a load impedance to have the lowest input reflected power or input reflection coefficient (input gamma).

During operation, the matching network can determine the input impedance by those methods described above with respect to FIG. 10, such as by using a VI (voltage-current) sensor located at the RF input of the matching network. Also similar to the embodiments discussed above, the matching network can use the input impedance information and the current EVC configuration (e.g., capacitor switch positions) and the frequency information to calculate a load impedance. Alternatively, rather than calculating the load impedance from input impedance and the calibration parameters of the match, the load impedance can be directly measured from an output sensor at the RF output of the matching network. In the exemplified embodiment, the load impedance to be calculated or otherwise determined is the impedance at the EVC output (see, e.g., EVC output 41B of FIG. 12). In certain embodiments, this load impedance is the variable chamber impedance and the impedance of the frequency-sensitive circuit (see frequency-sensitive circuit 37B of FIG. 12), though the invention to a particular load impedance.

Similar to the embodiments related to FIG. 10, the matching network can use the determined load impedance and the match lookup table to determine a new EVC configuration to provide a lower reflected power or input reflection coefficient at the RF input for helping enable an impedance match. Unlike the embodiment of FIG. 10, however, the new frequency provided by the RF source is determined independently of the determination of the new EVC configuration.

Returning to FIG. 3, the semiconductor processing system 85A can be understood as carrying out one or more of the embodiments discussed above. The matching network 11A has an input 13 coupled to an RF source 15 having a variable frequency, and an output coupled to a plasma chamber 19 having a variable chamber impedance. The matching network 11A further includes two capacitors, where capacitor 33A may be an EVC and capacitor 31A may be non-variable. The matching network 11A has a first control circuit 45 coupled to at least one of sensors 21 and sensor 49, the one or more sensors configured to detect an RF parameter. The control first circuit 45 may use a match lookup table (such as one of the lookup tables discussed above) with a value based on the detected RF parameter to determine a new EVC configuration for providing a new EVC capacitance. Once these determinations have been made, the first control circuit 45 can alter the EVC 33A to the new EVC configuration and thereby assist in causing an impedance match between the RF source and the plasma chamber. In one embodiment, this altering of the EVC configuration can be understood as one step towards causing an impedance match (the change in frequency being a different and separate step). In these embodiments, the first control circuit 45 controlling the EVC is separate and distinct from a second control circuit 16 for controlling the frequency of the RF source.

In the exemplified embodiment, the second control circuit 16 alters the variable frequency of the RF source 15, independently from the first control circuit, to further cause the impedance match between the RF source and the plasma chamber. In one embodiment, this frequency altering can be understood as a second (and possibly final) step in causing an impedance match, though the time of occurrence of the two steps may to some extent overlap. The first control circuit 45 does not provide instructions to the second control circuit 16 for controlling the variable frequency of the RF source 15. The second control circuit's frequency alteration occurs independently from the first control circuit.

In certain embodiments, the second control circuit can form part of the RF source. In other embodiments, the second control circuit can form part of the matching network. In yet other embodiments, the second control circuit can be distinct from both the RF source and the matching network.

In the exemplified embodiment, the value based on the detected RF parameter (used with the match lookup table) is the load impedance (e.g., the impedance at the EVC 33A output). In other embodiments, the RF parameter can be any RF parameter associated with the matching network or processing system. For example, the RF parameter may be detected at the RF input 13 (by sensor 21) or at the RF output 17 (by sensor 49). In some embodiments, the value based on the detected RF parameter can be the detected RF parameter itself. As with earlier embodiments, the EVC comprises discrete capacitors having different configurations defining ON and OFF states of the discrete capacitors, these different configurations causing the EVC to provide different capacitances.

In one embodiment, prior to an impedance match, the EVC has a first configuration defining ON and OFF states of the discrete capacitors. The first control circuit determines, based on the detected RF parameter, an input impedance at the RF input of the matching network. The control circuit then determines the load impedance from a parameter matrix lookup table using (1) the determined input impedance of the impedance matching network; and (2) the first configuration of the EVC. The control circuit then uses the determined load impedance with the match lookup table to determine the new EVC configuration. The sensor may be a voltage and current sensor positioned at the RF input of the matching network. Further, the parameter matrix lookup table may include two-port parameter matrices, such as S-parameter matrices or Z-parameter matrices. Further, the RF sensor may have any of the characteristic discussed above with regard to the previous embodiments, and the determination of the EVC configuration may use the match lookup table with a reflection coefficient.

Figure 11:
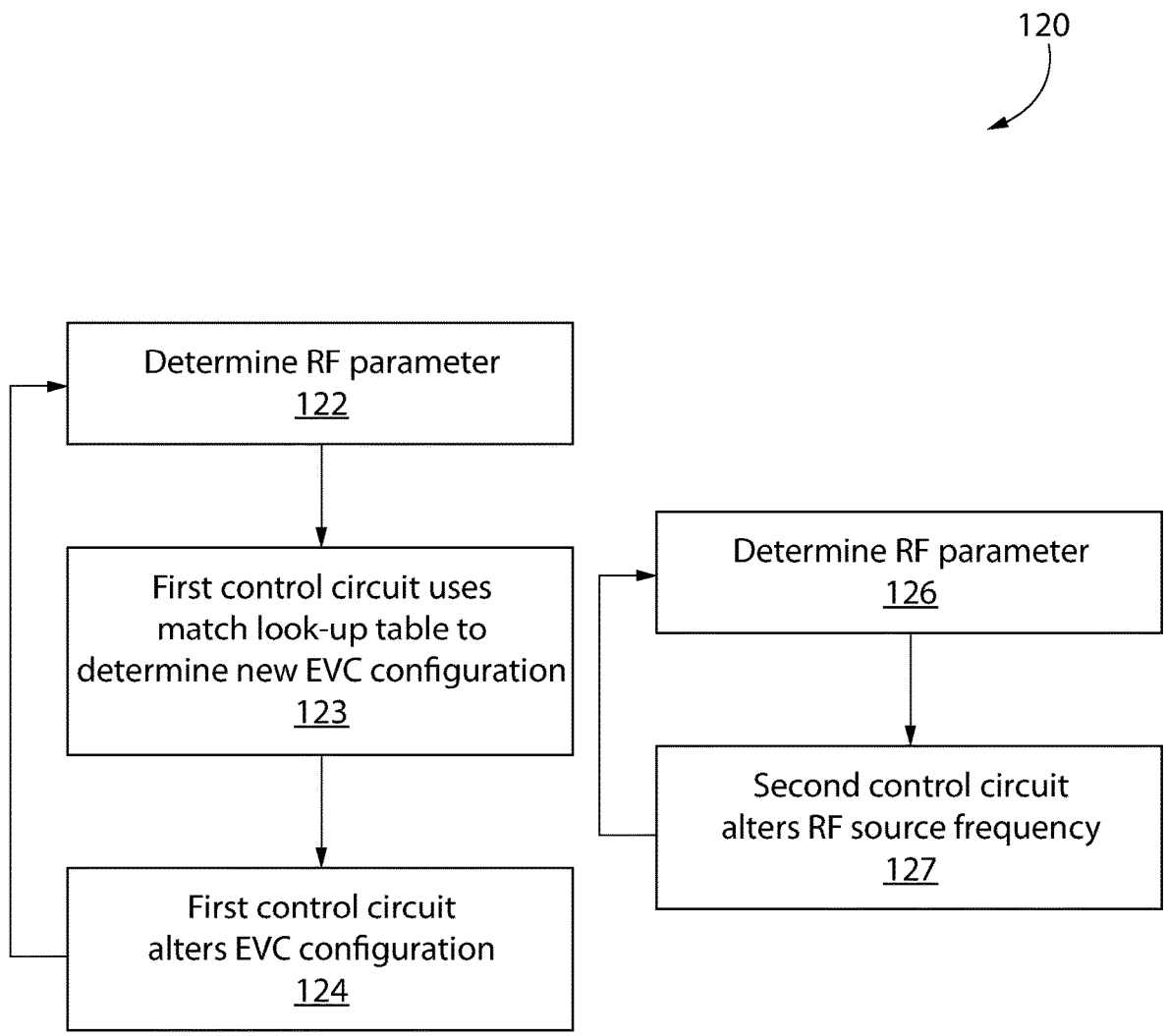
FIG. 11 is a flow chart showing an embodiment of a process for matching an impedance where capacitance and frequency are adjusted independently.

FIG. 11 is a flow chart showing an embodiment of a process 120 for matching an impedance where capacitance and frequency are adjusted independently. The process 120 includes an EVC subprocess 121 and a frequency subprocess 125 operating in parallel and independently. For the EVC subprocess 121, in a first step the sensor detects an RF parameter (step 122). To assist in causing an impedance match between the RF source and the plasma chamber, the first control circuit determines, using a match lookup table with value based on the detected RF parameter, a new EVC configuration for providing a new EVC capacitance (step 123). The first control circuit then alters the EVC to the new EVC configuration (step 124).

For the frequency subprocess 125, in a first step the second control circuit determines an RF parameter. In one embodiment, the RF parameter is a reflected power or reflection coefficient at the RF source output, though the invention is not so limited. In a second step, the second control circuit alters an RF source frequency based on the determined RF parameter.

The above process may be carried out as part of a method of manufacturing a semiconductor. Such a manufacturing method may include placing a substrate in the plasma chamber configured to deposit a material layer onto the substrate or etch a material layer from the substrate; and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

Figure 12:
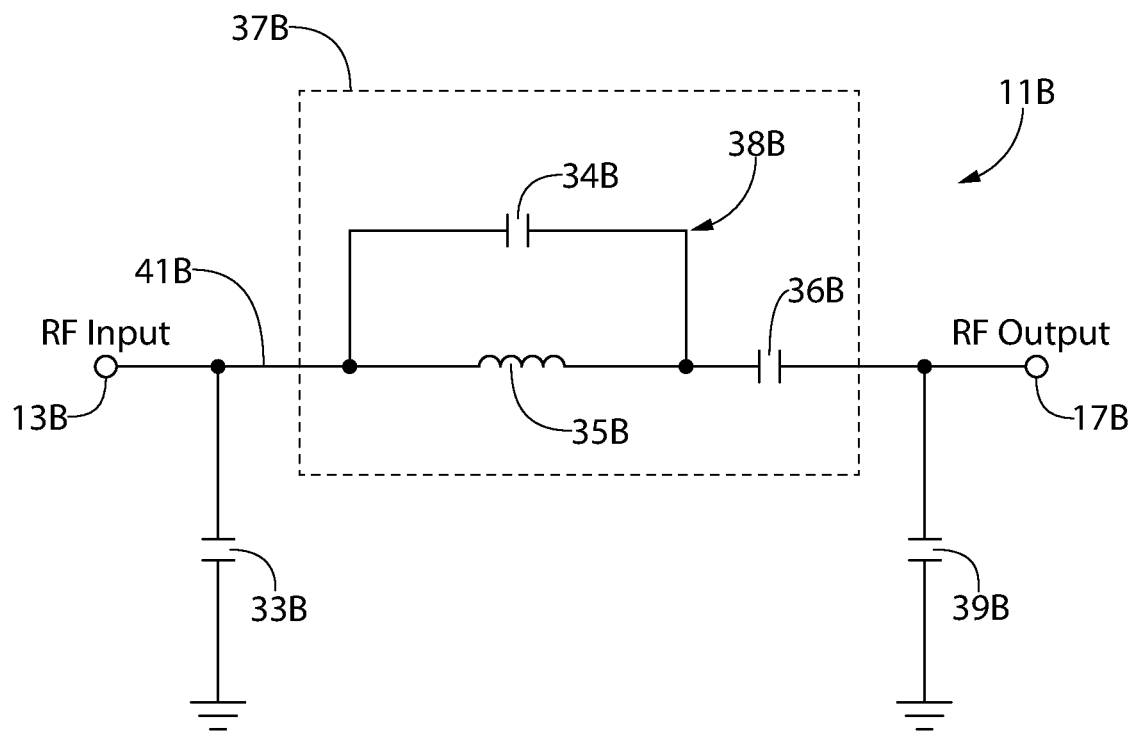
FIG. 12 is a schematic of an embodiment of a matching network having a frequency-sensitive circuit responsive to frequency adjustments.

FIG. 12 is a schematic of an embodiment of a matching network 11B having a frequency-sensitive circuit 37B responsive to frequency adjustments. The frequency-sensitive circuit is designed to have an impedance that can vary significantly when the variable frequency of the RF source is altered. In the exemplified embodiment, the frequency-sensitive circuit 37B includes an LC circuit 38B having a capacitor 34B and an inductor 35B. The frequency-sensitive circuit 37B can further include series capacitor 36B. In one embodiment, the variable chamber impedance can provide an inductance or capacitance for the LC circuit. The matching network 11B includes an input 13B and an output 17B. It further includes an EVC 33B having an EVC output 41B. A second capacitor 39B can also be included. This capacitor can be, for example, an EVC, a variable capacitor that is not an EVC (e.g., a vacuum variable capacitor), or a non-variable capacitor. As discussed, the determination of the new EVC configuration can use a match lookup table with a load impedance, and the load impedance in certain embodiments can be an impedance at an output 41B of the EVC, the EVC output impedance being the value based on the detected RF parameter. Further, the EVC output impedance can be the variable chamber impedance and the impedance of the frequency-sensitive circuit forming part of the impedance matching network.

The exemplified embodiment of FIG. 11 addresses the issue that the matching network may not be able control the frequency of the RF source. Further, communications between the match and generator may be slow, so they may not be able to send the frequency information fast enough for fast tuning. The current invention is based on the discovery that the matching network can match without knowledge of the frequency, or any frequency tuning being carried out by the generator. The matching network can view the frequency tuning elements as part of the load. Simulations were run to confirm the results, as well as testing units on static loads.

Simulations

Two tests were run, one on a 400 kHz variable matching network and the other on a 13.56 MHz variable matching network. The matching circuits were altered by adding capacitors around the inductor in both parallel and in series, as can be seen in FIG. 12. The frequency range for the 400 kHz unit is 360 kHz to 440 kHz, ±10%, and the shunt capacitor varies from 200 pF to 38,960 pF. For the 13.56 MHz unit, the frequency range is 12.88 MHz to 14.24 MHz, ±5%, and the capacitor range of 290 pF to 1910 pF. These are simplified models, as not all ESRs and other parasitics are accounted for.

As the frequency sweeps, the parallel capacitor gives the inductor a higher impedance at one end of the spectrum, while the series capacitor gives a lower inductance at the other end of the spectrum. In the case of the 13.56 MHz match, the circuit resonates and has a capacitive impedance at one end of the spectrum. This is what gives the frequency tuning its impedance variability on the imaginary axis.

The two matching circuits were then tested to verify that they were able to match fixed loads, and as a reference for later testing. This was done manually by varying the capacitor, and then the frequency. These two steps were then repeated until the VSWR was below an acceptable level, which was 1.1:1. The 400 kHz matched a load impedance of 45-j372, with a capacitance of approximately 12,197 and frequency of 416.9 kHz with a VSWR of 1.03:1. The 13.56 MHz unit also tuned into a fixed load with a frequency of 13.99 MHz and capacitance of about 425 pF.

Figure 13:
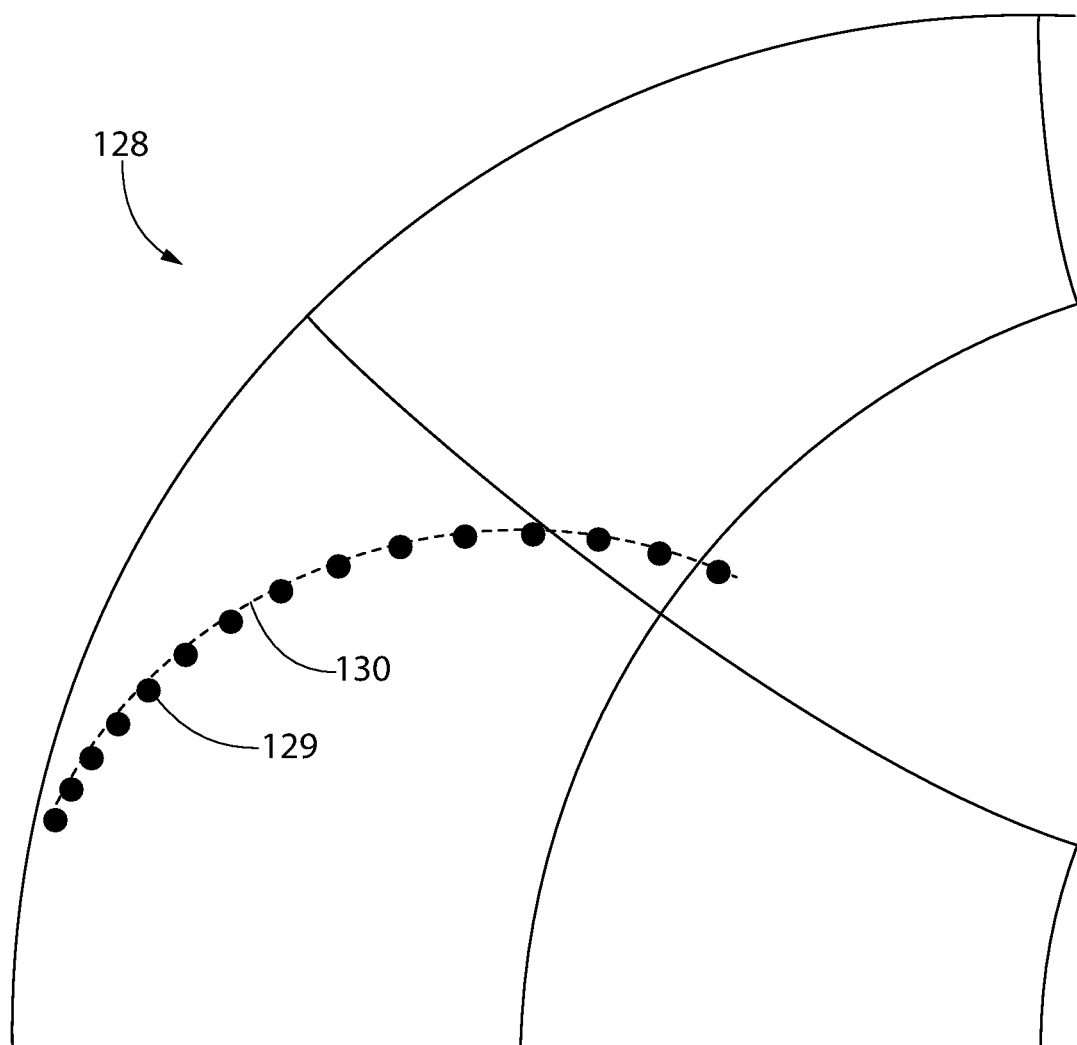
FIG. 13 is a portion of a Smith chart showing simulation results for a one-dimensional match.

The next set of testing assumed that the matching network neither has control of the generator, or any knowledge of the frequency. There are multiple reasons why this could be the case, as stated above. The first step was to remove the frequency-sensitive portion of the match. This leaves only the variable capacitor. This was done using a circuit similar to matching network 11B of FIG. 12, but where frequency-sensitive portion 37B and capacitor 39B are eliminated. The next step was to simulate and measure the two-port network parameters. FIG. 13 is a portion of a Smith chart 128 showing the simulation for fifteen different capacitor values 129 measured at 13.56 MHz, and their response 130 over frequency. It is shown that, as the frequency shifts, the impedance shifts towards the nearest point, filling in the arc.

This was noteworthy, because it indicates that the change in impedance caused by an increase or decrease in percentage of capacitance is equivalent to the change in impedance due to an increase or decrease in percentage of frequency, as one would expect in view of Equation 1 below.

$$X_c = \frac{1}{2\pi * \Delta\% freq * C} = \frac{1}{2\pi * freq * \Delta\% C}$$

Further, one could say that this is similar to adding or removing a shunt capacitor in parallel to the variable capacitor. The capacitor in parallel with the variable capacitor could be considered part of the load, as it is attached to the same node.

Thus, it can be assumed for a one-dimensional match that the change in capacitance due to frequency is equivalent to a change in the load, having a capacitor at the input shunt leg. When running in auto-tune mode, the match would see this change in frequency as a change in the load. Thus, if the load changes by a certain percentage due to frequency, the variable capacitor would adjust by a proportionate difference but in the opposite sign to counteract the change in impedance.

The next step was to look at the matching algorithm and how it would react to changes in frequency. To do this, the one-dimensional match circuit was simulated at three different frequencies, 13.56 MHz and at ±5%, and with 169 different capacitor values ranging from 290 pF to 1910 pF. The Z-Parameters were calculated for each combination, and then the best matching capacitance table was generated by inputting a different load impedance with each set of Z-Parameters and finding which position had the lowest gamma for each load at each frequency.

The next step was to use a list of various input impedances and the Z-Parameters to calculate different load impedances for each frequency at different capacitor positions. For example, when the variable capacitor is at 50%, and the input impedance is determined to be 20+j0Ω, the load impedance for each frequency can be calculated. These calculated load impedances are then used to find the best match position on the lookup table.

Since the V/I sensor has little change when the frequency is swept, we can assume the input impedance reading would not be affected by it changing. The V/I sensor also assumes that the frequency is 13.56 MHz. To measure the accuracy of the match over frequency, the best match capacitor percentage will be compared to the other two frequencies finding their perspective best matches for their calculated loads. So, at 50% capacitance and an input impedance of 20+j0Ω, the 13 MHz match will have a load of 4.9+j10.3Ω, the 12.88 MHz will have a load of 5.5+10.6Ω, and the 14.24 MHz will have a load of 4.4+j10.0Ω. Multiple input impedances were randomly picked and their data can be found below in Table 2.

TABLE 2

Frequency versus Best Match Capacitor Position

| Input Impedance | Capacitor Start Position | Capacitor End Position | | |
|---|---|---|---|---|
| | | 12.88 MHz | 13.56 MHz | 14.24 MHz |
| 20 + j0 | 25.0% | 11.3% | 11.9% | 11.9% |
| 20 + j0 | 50.0% | 36.3% | 36.9% | 36.9% |
| 20 + j0 | 75.0% | 61.9% | 61.9% | 61.9% |
| 50 + j50 | 25.0% | 36.3% | 35.7% | 35.7% |
| 50 + j50 | 50.0% | 61.3% | 60.7% | 60.1% |
| 50 + j50 | 75.0% | 86.3% | 85.1% | 85.1% |
| 50 − j50 | 25.0% | 20.8% | 21.4% | 21.4% |
| 50 − j50 | 50.0% | 45.8% | 46.4% | 47.0% |
| 50 − j50 | 75.0% | 70.8% | 72.0% | 72.0% |
| 200 + j0 | 25.0% | 28.6% | 28.6% | 29.2% |
| 200 + j0 | 50.0% | 54.2% | 54.2% | 54.2% |
| 200 + j0 | 75.0% | 80.4% | 79.8% | 79.2% |

As it can be seen in Table 2, the best match positions are extremely close to one another across frequency. The major source of error is from quantization, where the load impedances were calculated to the nearest 0.1Ω for the lookup table, and there are only 169 different capacitor positions.

Testing was done with both the 400 kHz unit and the 13.56 MHz unit. The S-parameters were measured and the best match table was calculated for specified load impedance ranges. The unit was set to automatically change the capacitor position while the frequency was varied manually. For the 400 kHz unit, the load was again set to 45-j372Ω. The matched condition was at frequency 417 kHz, 100 Hz higher than the manually tuned test, and a capacitance of approximately 12,428 pF, one fine cap position more than in the manually tuned test, giving a VSWR of 1.04:1. The 13.56 MHz match was also tuned to its load. The matched condition was at frequency 13.98 MHz, which was 10 kHz less than the manually tuned test, and the capacitance was about 435 pF, one fine position higher than the manually tuned test. This gave a VSWR of 1.07:1.

It was concluded that a one-dimensional EVC match with variable frequency sweep tuning was capable of working. With the input V/I sensor and two-port network parameters, the change in impedance due to frequency was equivalent to a load with a change in an input shunt capacitor. The tuning tables show that the variable capacitor's value will be the same at different frequencies for a given input impedance. The testing showed that the algorithm works with a manually adjusted frequency.

While the embodiments of a matching network discussed herein have used L or pi configurations, it is noted that he claimed matching network may be configured in other matching network configurations, such as a 'T' type configuration. Unless stated otherwise, the variable capacitors, switching circuits, and methods discussed herein may be used with any configuration appropriate for an RF impedance matching network.

While the embodiments discussed herein use one or more variable capacitors in a matching network to achieve an impedance match, it is noted that any variable reactance element can be used. A variable reactance element can include one or more discrete reactance elements, where a reactance element is a capacitor or inductor or similar reactive device.

While the inventions have been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:

1. A radio frequency (RF) impedance matching network comprising:
   an RF input configured to operably couple to an RF source having a variable frequency;
   an RF output configured to operably couple to a plasma chamber having a variable chamber impedance;
   an electronically variable capacitor (EVC) having a variable capacitance;
   a first control circuit operably coupled to the EVC and to a sensor configured to detect an RF parameter, the first control circuit controlling the EVC and being separate and distinct from a second control circuit controlling the RF source;

wherein, to assist in causing an impedance match between the RF source and the plasma chamber, the first control circuit is configured to:
  determine, using a match lookup table with a value based on the detected RF parameter, a new EVC configuration for providing a new EVC capacitance; and
  alter the EVC to the new EVC configuration; and
wherein the first control circuit does not provide instructions to the second control circuit for controlling the variable frequency of the RF source, such that, in further causing the impedance match between the RF source and the plasma chamber, the second control circuit alters the variable frequency of the RF source independently from the first control circuit.

2. The matching network of claim 1 wherein the second control circuit forms part of the RF source.

3. The matching network of claim 1 further comprising a frequency-sensitive circuit separate from the EVC, the frequency-sensitive circuit having an impedance that varies when the variable frequency of the RF source is altered.

4. A method of impedance matching comprising:
  operably coupling an RF input of an impedance matching network to an RF source having a variable frequency;
  operably coupling an RF output of the impedance matching network to a plasma chamber having a variable chamber impedance, wherein the impedance matching network further comprises an electronically variable capacitor (EVC) having a variable capacitance, and the impedance matching network is configured to cause an impedance match between the RF source and the plasma chamber;
  operably coupling a first control circuit to the EVC and to a sensor, the first control circuit controlling the EVC and being separate and distinct from a second control circuit controlling the RF source;
  detecting, by the sensor, an RF parameter;
  determining, by the first control circuit, using a match lookup table with a value based on the detected RF parameter, a new EVC configuration for providing a new EVC capacitance,
  altering, by the first control circuit, the EVC to the new EVC configuration; and
  altering, by the second control circuit, the variable frequency of the RF source;
  wherein the first control circuit does not provide instructions to the second control circuit for controlling the variable frequency of the RF source.

5. The method of claim 4 wherein the second control circuit forms part of the RF source.

6. The method of claim 4 wherein the matching network further comprises a frequency-sensitive circuit separate from the EVC, the frequency-sensitive circuit having an impedance that varies when the variable frequency of the RF source is altered.

7. The method of claim 6 wherein the frequency-sensitive circuit comprises an LC circuit.

8. The method of claim 7 wherein the variable chamber impedance provides an inductance or capacitance for the LC circuit.

9. The method of claim 4 wherein the determination of the new EVC configuration uses the match lookup table with an impedance at an output of the EVC, the EVC output impedance being the value based on the detected RF parameter.

10. The method of claim 9 wherein the EVC output impedance comprises the variable chamber impedance and the impedance of a frequency-sensitive circuit forming part of the impedance matching network, the impedance of the frequency-sensitive circuit varying when the variable frequency of the RF source is altered.

11. The method of claim 4:
  wherein the EVC comprises discrete capacitors and has a first configuration defining ON and OFF states of the discrete capacitors; and
  wherein the first control circuit:
    determines, based on the detected RF parameter, an input impedance at the RF input of the matching network; and
    determines an impedance at an output of the EVC from a parameter matrix lookup table using:
      the determined input impedance of the impedance matching network; and
      the first configuration of the EVC;
    wherein the determination of the new EVC configuration uses the determined EVC output impedance with the match lookup table.

12. The method of claim 11 wherein the sensor is a voltage and current sensor positioned at the RF input of the matching network.

13. The method of claim 11 wherein the parameter matrix lookup table comprises two-port parameter matrices.

14. The method of claim 4 wherein the RF sensor is a phase or magnitude detector operably coupled to the RF input of the matching network, and the detected RF parameter used for the determination of the new EVC configuration is a phase error or a magnitude error.

15. The method of claim 4 wherein the RF sensor is operably coupled to the RF input of the matching network, and the detected RF parameter is at least one of a voltage, a current, or a phase at the RF input.

16. The method of claim 15 wherein the determination of the new EVC configuration uses the match lookup table with a reflection coefficient based on the at least one of the voltage, the current, or the phase, the reflection coefficient being the value based on the detected RF parameter.

17. The method of claim 4 wherein the RF sensor is operably coupled to an output of the EVC, and the determination of the new EVC configuration uses the match lookup table with an impedance at an output of the EVC, the EVC output impedance based on the RF parameter detected by the RF sensor at the RF output.

18. The method of claim 4:
  wherein the EVC comprises discrete capacitors, each discrete capacitor having a corresponding switch to activate or deactivate the discrete capacitor; and
  wherein the EVC is altered to the new EVC configuration by activating or deactivating at least one of the discrete capacitors of the EVC.

19. The method of claim 18 wherein the corresponding switch is in series with or parallel to the discrete capacitor.

20. A method of manufacturing a semiconductor comprising:
  placing a substrate in a plasma chamber configured to deposit a material layer onto the substrate or etch a material layer from the substrate; and
  energizing plasma within the plasma chamber by coupling RF power from an RF source into the plasma chamber to perform a deposition or etching, and while energizing the plasma, causing an impedance match between the RF source and the plasma chamber by:
    operably coupling an RF input of an impedance matching network to the RF source, the RF source having a variable frequency;

operably coupling an RF output of the impedance matching network to the plasma chamber, the plasma chamber having a variable chamber impedance, wherein the impedance matching network further comprises an electronically variable capacitor (EVC) having a variable capacitance;

operably coupling a first control circuit to the EVC and to a sensor, the first control circuit controlling the EVC independently from a second control circuit controlling the RF source;

detecting, by the sensor, an RF parameter;

determining, by the first control circuit, using a match lookup table with a value based on the detected RF parameter, new EVC configuration for providing a new EVC capacitance; and altering, by the first control circuit, the EVC to the new EVC configuration; and altering by the second control circuit, the variable frequency of the RF source;

wherein the first control circuit does not provide instructions to the second control circuit for controlling the variable frequency of the RF source.

21. A semiconductor processing tool comprising:

a plasma chamber configured to deposit a material onto a substrate or etch a material from the substrate; and an impedance matching network operably coupled to the plasma chamber, matching circuit comprising:

an RF input configured to operably couple to an RF source having a variable frequency;

an RF output configured to operably couple to the plasma chamber, the plasma chamber having a variable chamber impedance;

an electronically variable capacitor (EVC) having a variable capacitance;

a first control circuit operably coupled to the EVC and to a sensor configured to detect an RF parameter, the first control circuit controlling the EVC and being separate and distinct from a second control circuit controlling the RF source;

wherein, to assist in causing an impedance match between the RF source and the plasma chamber, the first control circuit is configured to:

determine, using a match lookup table with a value based on the detected RF parameter, a new EVC configuration for providing a new EVC capacitance; and alter the EVC to the new EVC configuration; and wherein the first control circuit does not provide instructions to the second control circuit for controlling the variable frequency of the RF source, such that, in further causing the impedance match between the RF source and the plasma chamber, the second control circuit alters the variable frequency of the RF source independently from the first control circuit.

* * * * *